(12) United States Patent
Slonczewski

(10) Patent No.: US 8,064,246 B2
(45) Date of Patent: Nov. 22, 2011

(54) CREATING SPIN-TRANSFER TORQUE IN OSCILLATORS AND MEMORIES

(76) Inventor: John Casimir Slonczewski, Katonah, NY (US)

(*) Notice: Subject to any disclaimer, the term of this patent is extended or adjusted under 35 U.S.C. 154(b) by 0 days.

(21) Appl. No.: 12/963,557

(22) Filed: Dec. 8, 2010

(65) Prior Publication Data
US 2011/0141797 A1      Jun. 16, 2011

Related U.S. Application Data

(60) Provisional application No. 61/285,332, filed on Dec. 10, 2009, provisional application No. 61/368,352, filed on Jul. 28, 2010, provisional application No. 61/368,540, filed on Jul. 28, 2010.

(51) Int. Cl.
*G11C 11/15* (2006.01)
*G11C 11/00* (2006.01)

(52) U.S. Cl. .......... 365/158; 365/175; 365/145

(58) Field of Classification Search ........ 365/173, 365/158, 145
See application file for complete search history.

(56) References Cited

U.S. PATENT DOCUMENTS

| | | | |
|---|---|---|---|
| 5,650,958 A | 7/1997 | Gallagher et al. | |
| 5,695,864 A | 12/1997 | Slonczewski | |
| 5,764,567 A | 6/1998 | Parkin | |
| 5,923,504 A * | 7/1999 | Araki et al. | 360/324.11 |
| 6,385,082 B1 | 5/2002 | Abraham et al. | |
| 6,771,534 B2 | 8/2004 | Stipe | |
| 6,963,098 B2 | 11/2005 | Daughton et al. | |
| 7,149,106 B2 | 12/2006 | Mancoff et al. | |
| 7,266,013 B2 | 9/2007 | Daughton et al. | |
| 7,372,722 B2 * | 5/2008 | Jeong et al. | 365/158 |
| 7,379,280 B2 | 5/2008 | Fukumoto et al. | |
| 7,411,817 B2 | 8/2008 | Nozieres et al. | |
| 7,663,171 B2 | 2/2010 | Inokuchi et al. | |
| 7,742,263 B2 | 6/2010 | Fukumoto et al. | |
| 7,808,330 B2 | 10/2010 | Fukuzawa et al. | |
| 2001/0031547 A1 | 10/2001 | Ohno et al. | |
| 2004/0004261 A1 | 1/2004 | Takahashi et al. | |
| 2004/0100835 A1 | 5/2004 | Sugibayashi et al. | |
| 2005/0226043 A1 | 10/2005 | Parkin et al. | |
| 2007/0058422 A1 | 3/2007 | Phillips et al. | |
| 2007/0268743 A1 | 11/2007 | Daughton et al. | |

(Continued)

OTHER PUBLICATIONS

Entire Prosecution History of U.S. Appl. No. 61/285,332, filed Dec. 10, 2009 by John Casimir Slonczewski.

(Continued)

*Primary Examiner* — Hoai V Ho
*Assistant Examiner* — Min Huang
(74) *Attorney, Agent, or Firm* — Silicon Valley Patent Group LLP; Omkar Suryadevara

(57) ABSTRACT

A structure includes an electrically conductive material possessing spontaneous magnetization ("free magnet") not in contact with an electrically resistive material possessing spontaneous magnetization ("pinned magnet"), and a spacer having free electrons to transfer spin between the electrically resistive material and the electrically conductive material. During operation, an existing direction of magnetization of the free magnet is changed to a new direction of magnetization, by a spin current generated by transfer of heat between at least the spacer and the pinned magnet. Thereafter, the new direction of magnetization of the free magnet is sensed. Many such structures are fabricated to have an easy axis of magnetic anisotropy in the free magnet, to implement memories that write data by transferring heat. Several such structures are fabricated to have an easy plane of magnetic anisotropy in the free magnet, to implement oscillators that generate an oscillating signal, on transfer of heat.

61 Claims, 14 Drawing Sheets

U.S. PATENT DOCUMENTS

| | | |
|---|---|---|
| 2008/0165453 A1 | 7/2008 | Kaiser et al. |
| 2009/0141540 A1* | 6/2009 | Miura et al. ............... 365/158 |
| 2009/0207653 A1* | 8/2009 | Abraham et al. ........... 365/171 |
| 2010/0039181 A1 | 2/2010 | Firastrau et al. |
| 2010/0140726 A1* | 6/2010 | Apalkov et al. ............. 257/421 |

OTHER PUBLICATIONS

Entire Prosecution History of U.S. Appl. No. 61/368,352, filed Jul. 28, 2010 by John Casimir Slonczewski.

Entire Prosecution History of U.S. Appl. No. 61/368,540, filed Jul. 28, 2010 by John Casimir Slonczewski.

Slonczewski, J. C. "Magnetic-field Tunnel-sensor", IBM Technical Disclosure Bulletin, vol. 19. No. 6. Nov. 1976, pp. 2331-2332.

Hatami, M. et al. "Thermal Spin-Transfer Torque in Magnetoelectronic Devices", Physical Review Letters 99, 066603 (2007), pp. 4.

Yu, et al. "Evidence for Thermal Spin-Transfer Torque", Physical Review Letters 104, 146601 (2010), pp. 4.

Papusoi, et al. "Probing fast heating in magnetic tunnel junction structures with exchange bias", New Journal of Physics 10 103006 (2008), pp. 15.

Dionne, G. F. "Magnetic Oxides", Sections 4.3.1 -3, Springer, New York, 2009, pp. 18.

Stoner, R. J. et al. Kapitza Conductance and Heat Flow Between Solids At Temperatures From 50 to 300 K, Physical Review B, vol. 48, No. 22, Dec. (1993-II), pp. 15.

Shams, N. N. et al. "Magnetic properties of BaM/Pd-Pt double-layered thin film deposited at various substrate temperatures", Journal of Applied Physics, 97, 10K305 (2005), pp. 3.

Slonczewski, J. C. "Initiation of spin-transfer torque by thermal transport from magnons", Physical Review B 82, 054403 (2010), Aug. 3, 2010, pp. 11.

Stiles, M. D. "Theory of Spin Transfer Torque", Oct. 17, 2005, pp. 29.

Sun, J. Z. et al. "Magnetoresistance and spin-transfer torque in magnetic tunnel junctions", Journal of Magnetism and Magnetic Materials 320 (2008), pp. 1227-1237.

Dieny, B. et al. "Spin-transfer effect and its use in spintronic components", Int. J. Nanotechnol., vol. 7, Nos. 4/5/6/7/8, 2010, pp. 591-614.

Fert, A. et al. "The new era of spintronics", Europhysics News, Nov./Dec. 2003, pp. 227-229.

Ralph, D. C. et al. "Spin transfer torques", Journal of Magnetism and Magnetic Materials 320 (2008), pp. 1190-1216.

Landeros, P. et al. "Role of the spin transfer in the ferromagnetic resonance response of thin films", Physical Review B 81, 214434 (2010), pp. 8.

Slachter, A. et al. "Thermally driven spin injection from a ferromagnet into a non-magnetic metal", Physics of Nanodevices, Zernike Institute for Advanced Materials, University of Groningen, The Netherlands, Apr. 12, 2010, pp. 7.

Zutic, I. "Spintronics: Fundamentals and applications", Reviews of Modern Physics, vol. 76, Apr., 2004, pp. 88.

Chiolerio, A. "Spintronic Devices", PhD Thesis, Feb. 11, 2009, pp. 120.

Cros, V. et al. "Spin Transfer Torque: a new method to excite or reverse a magnetization", C.R. Physique 6, 2005, pp. 956-965.

Duine, R. A. "Spintronics", Institute for Theoretical Physics, Utrecht University, the Netherlands, Feb. 24, 2010, pp. 81.

Bruno, P. "Spin-dependent transport in layered magnetic metals", Germany, believed to be prior to Dec. 8, 2010, pp. 30.

Magnon, retrieved from Wikipedia http://en.wikipedia.org/wiki/Magnon on Aug. 24, 2010, pp. 2.

Slonczewski, J. C. "Conductance and exchange coupling of two ferromagnets separated by a tunneling barrier", Physical Review B, vol. 39, No. 10, Apr. 1, 1989, pp. 8.

Berger, L. "Emission of spin waves by a magnetic multilayer traversed by a current", Physical Review B, vol. 54, No. 13, Oct. 1, 1996, pp. 6.

Slonczewski, J. C "Current-driven excitation of magnetic multilayers", Journal of Magnetism and Magnetic Materials 159 (1996), L1-L7, pp. 7.

Katine, J. A. et al. "Current-Driven Magnetization Reversal and Spin-Wave Excitations in Co/Cu/Co Pillars", Physical Review Letters, vol. 84, No. 14, Apr. 3, 2000, pp. 4.

Kiselev, S. et al. "Microwave oscillations of a nanomagnet driven by a spin-polarized current", Nature, vol. 425, Sep. 2003, pp. 380-383.

Hosomi, M. et al. "A Novel Nonvolatile Memory with a Spin Torque Transfer Magnetization Switching: Spin-RAM", IEEE International, 2005, pp. 4.

Deac, A. M. et al. "Large Power Microwave Precession for New Spintronics Devices With Giant Tunnel Magnetoresistance", Nature Physics 4, 803 (2008), pp. 19.

Uchida, K. et al. "Observation of the spin Seebeck effect", Nature Letters, vol. 455, Oct. 9, 2008, pp. 778-781.

Uchida, K. et al. "Phenomenological analysis for spin-Seebeck effect in metallic magnets", Journal of Applied Physics, 105, 07C908, 2009, pp. 3.

Hatami, M. et al. "Thermoelectric effects in magnetic nanostructures", Physical Review B 79 174426, 2009, pp. 13.

Takahachi, S. et al. "Spin current through a normal-metal/insulating-ferromagnet Junction", International Conference on Magnetism (ICM 2009), Journal of Physics: Conference Series 200 (2010) 062030, pp. 4.

Prejbeanu, I. L. et al. "Thermally Assisted MRAM", Journal of Physics: Condensed Matter 19, 165218, (2007), pp. 23.

Kajiwara, Y. et al. "Transmission of electrical signals by spin-wave interconversion in a magnetic insulator", Nature Letters, vol. 464, Mar. 11, 2010, pp. 22.

Xiao J. et al., "Theory of magnon-driven spin Seebeck effect", Physical Review B 81 214418 (2010), published Jun. 14, 2010, pp. 8.

Kittel, C. "Magnons", Introduction to Solid State Physics, $5^{th}$ Edition, 1976, pp. 6.

* cited by examiner

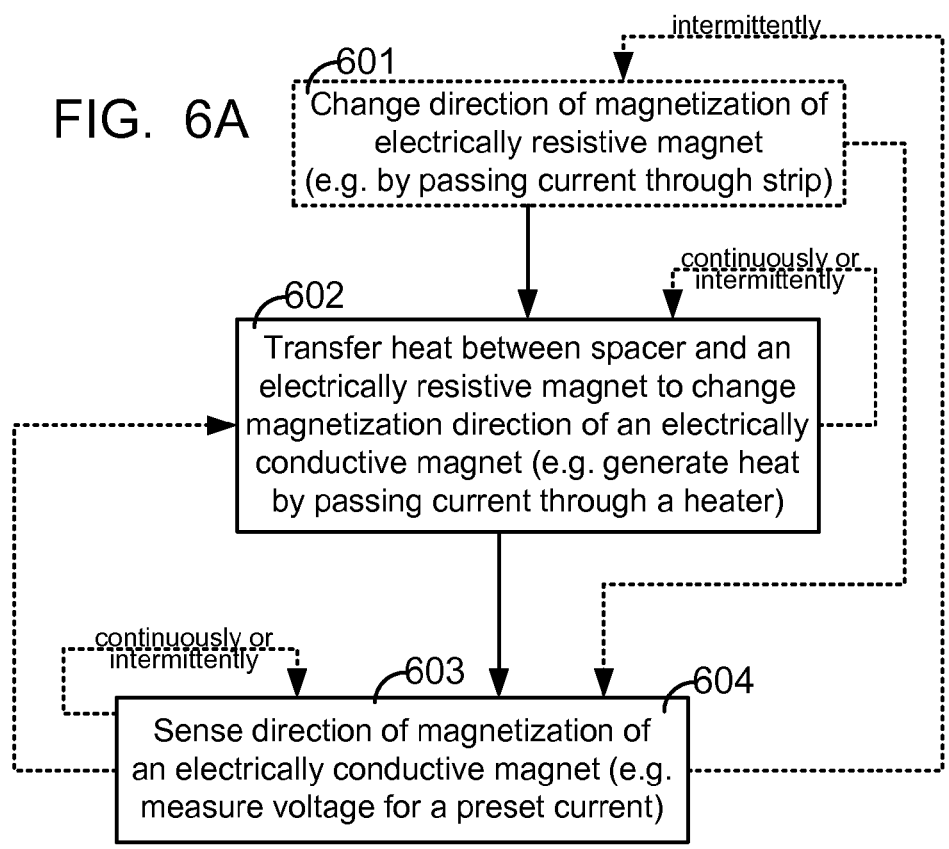
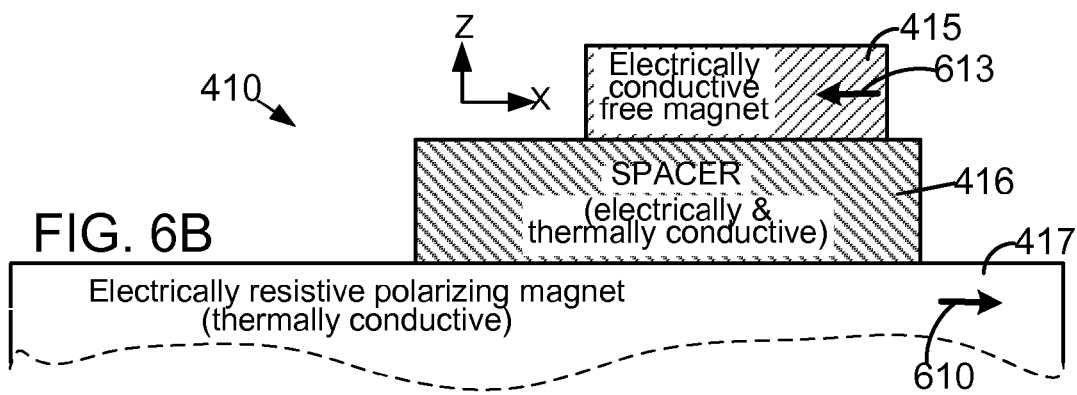
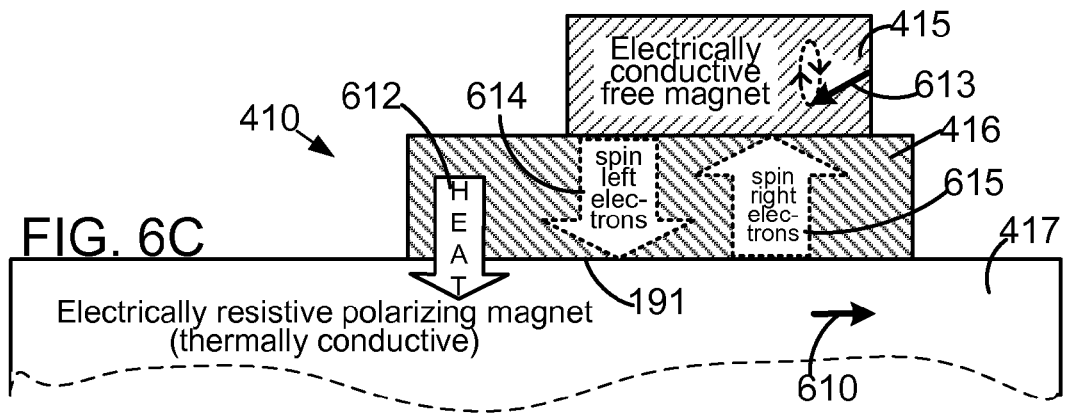

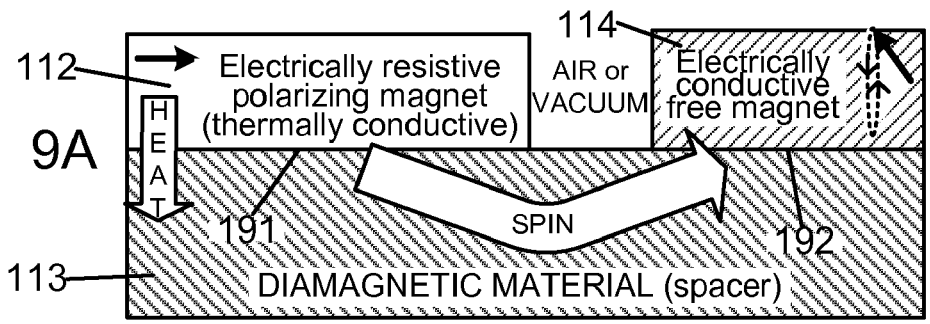
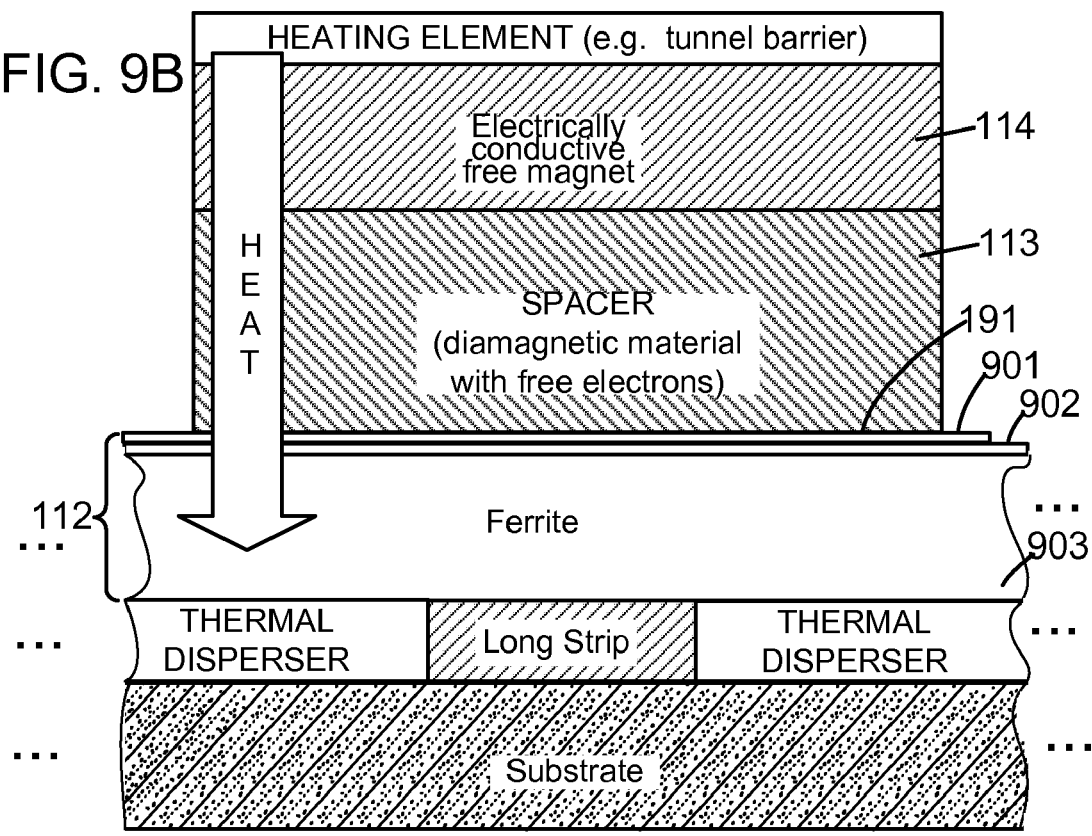
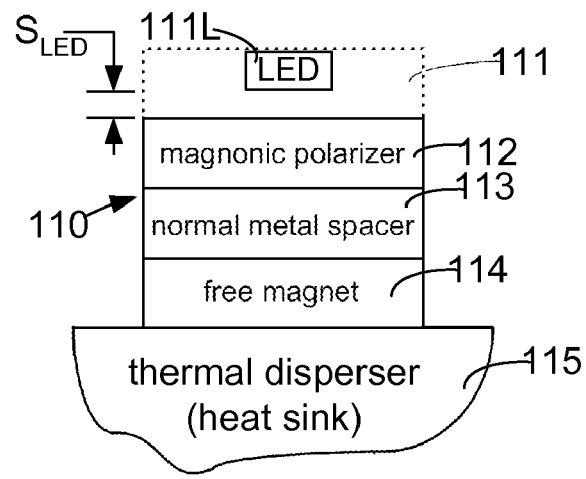

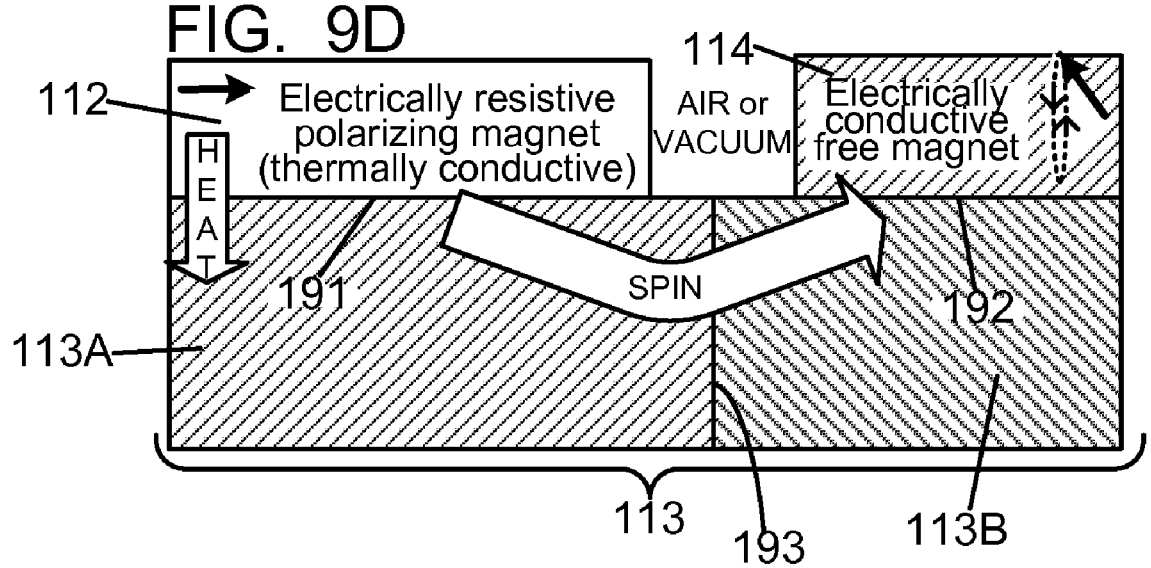
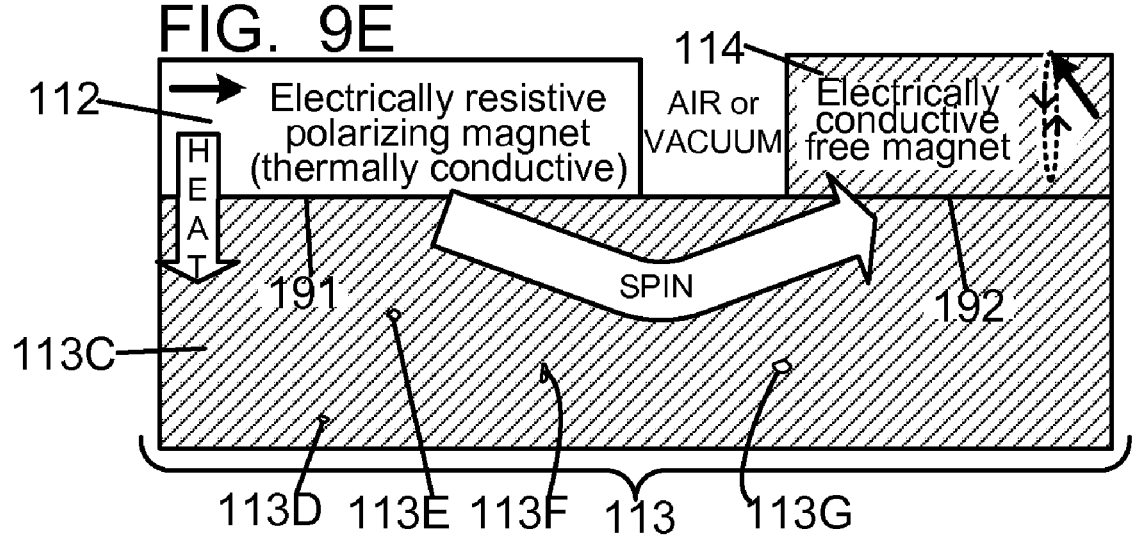

CREATING SPIN-TRANSFER TORQUE IN OSCILLATORS AND MEMORIES

CROSS-REFERENCE TO PRIORITY APPLICATIONS

This application claims the benefit of and priority to U.S. Provisional Patent Application No. 61/285,332, filed on Dec. 10, 2009, by John Casimir Slonczewski as the inventor, entitled "Magnetic Oscillator and Random-Access Memory Cell" and which is incorporated herein by reference in its entirety.

This application also claims the benefit of and priority to U.S. Provisional Patent Application No. 61/368,352, filed on Jul. 28, 2010, by John Casimir Slonczewski as the inventor, entitled "Method of Creating Spin-Transfer Torque in a Magnetic Oscillator and a Random-Access Memory Cell" and which is incorporated herein by reference in its entirety.

This application further claims the benefit of and priority to U.S. Provisional Patent Application No. 61/368,540, filed on Jul. 28, 2010, by John Casimir Slonczewski as the inventor, entitled "Material Compositions for Thermagnonic Spin Transfer Torque" and which is incorporated herein by reference in its entirety.

BACKGROUND

Spintronics relates to use of spin of electrons in various types of devices, such as oscillators and random access memory (RAM). Several such prior art devices use an electrically resistive layer between two layers of metallic magnets, to form a magnetic tunnel junction (MTJ). One of the just-described two metallic magnets has its magnetization fixable into one of two directions in a plane of the layer of the magnet, depending on a direction of electric current. The magnetization of the other of the two metallic magnets can rotate in the plane of the layer. Passage of an electric current through the fixable-magnetization layer generates a spin current, whose absorption in the rotatable-magnetization layer gives rise to a spin transfer torque that changes the direction of magnetization of the rotatable-magnetization layer.

For additional details on such a three layered structure, see an article entitled "Magnetic-field Tunnel-sensor" by J. C. Slonczewski published in the IBM Technical Disclosure Bulletin. vol. 19. No. 6. Nov. 1976. pp. 2331-2332, which is incorporated by reference herein in its entirety as background.

In several devices of the prior art, electric current flows through an electrically conducting polarizing magnet, to generate a spin current whose absorption gives rise to a torque in a free magnet. As additional background, the following patents are incorporated by reference herein in their entirety:

(a) U.S. Pat. No. 5,695,864 granted to Slonczewski on Dec. 9, 1997, and entitled "Electronic device using magnetic components";

(b) U.S. Pat. No. 7,149,106 granted to Mancoff, et al. on Dec. 12, 2006, and entitled "Spin-transfer based MRAM using angular-dependent selectivity";

(c) U.S. Pat. No. 7,808,330 granted to Fukuzawa, et al. on Oct. 5, 2010 and entitled "High-frequency oscillator";

(d) U.S. Pat. No. 6,771,534 granted to Stipe on Aug. 3, 2004, and entitled "Thermally-assisted magnetic writing using an oxide layer and current-induced heating."

As further background, the following articles are also incorporated by reference herein in their entirety:

(f) Hatami et al, Phys. Rev. Lett. 99, 066603 (2007) "Thermal Spin-Transfer Torque in Magnetoelectronic Devices"; and (g) Yu et al, Phys. Rev. Lett. 104, 146601 (2010) "Evidence of thermal spin-transfer torque."

SUMMARY OF THE DISCLOSURE

A structure in accordance with the invention includes an electrically conductive material possessing spontaneous magnetization (also called "free magnet") not in contact with an electrically resistive material possessing spontaneous magnetization (also called "pinned magnet"), and a spacer having free electrons to transfer spin between the electrically resistive material and the electrically conductive material. During operation, a first direction of magnetization of the free magnet is changed to a second direction of magnetization, by a spin current that is generated by transfer of heat between at least the spacer and the pinned magnet. Thereafter, the second direction of magnetization of the free magnet is sensed in one or more structures in accordance with the invention. Many such structures are fabricated to have an easy axis of magnetic anisotropy in the free magnet, to implement memories that write data, by transfer of heat in accordance with the invention. Several such structures are fabricated to have an easy plane of magnetic anisotropy in the free magnet, to implement oscillators that generate an oscillating output signal, upon transfer of heat in accordance with the invention.

It is understood that other aspects will become readily apparent to those skilled in the art from the following detailed description, wherein it is shown and described various aspects, embodiments, devices and methods by way of illustration. The drawings and detailed description are to be regarded as illustrative in nature and not as restrictive.

BRIEF DESCRIPTION OF THE DRAWINGS

FIG. 6A illustrates, in a flow chart, acts performed during operation of several structures in accordance with the invention.

FIGS. 6B-6K illustrate, in cross-sectional views, change in the spin moment vectors 610 and 613 when performing the acts illustrated in FIG. 6A.

FIGS. 9A-9E illustrate, in cross-sectional views, various structures in several aspects in accordance with the invention.

DETAILED DESCRIPTION

Figure 1A:
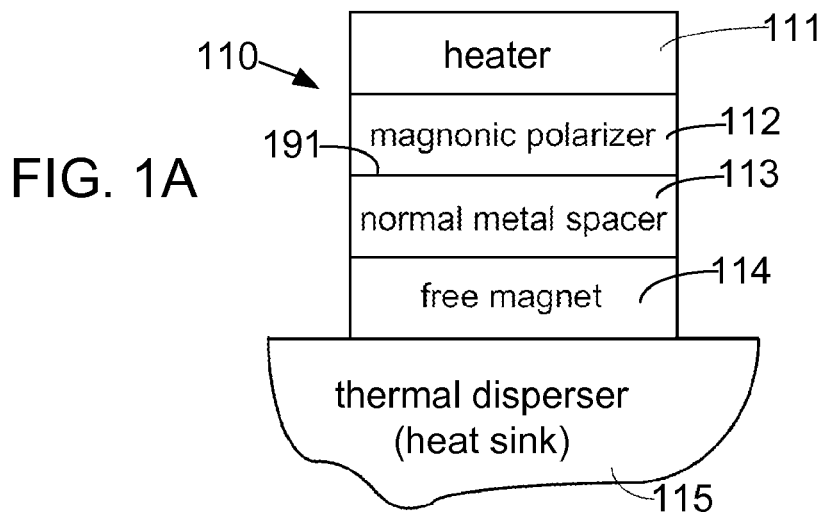
FIG. 1A illustrates a structure in the form of a stack 110 in accordance with the invention that includes a free magnet 114 not in contact with a pinned magnet 112, and a spacer 113 located in direct contact with each of magnets 112 and 114.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for the purpose of providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the disclosure.

Some aspects of this invention provide a highly efficient method of creating spin-transfer torque for use in magnetic oscillators and random-access memories. In many aspects of the invention, an externally sourced flow of heat through an electrically resistive first magnet (also called "polarizing" magnet or "pinned" magnet or "magnonic polarizer") creates a current of electron-spin polarization that flows through a conducting normal non-magnetic metal spacer into a second, metallic magnet (also called "free" magnet). This spin current creates a torque that excites the magnetic moment of this second magnet into a state of precession. Making this precession steady by providing a unique easy plane of magnetic anisotropy creates a spintronic magnetic oscillator in accordance with this invention. Making this precession transient by providing a unique easy axis of magnetic anisotropy leads to switching of the second moment for the write operation in a magnetic memory cell in accordance with this invention. Both of the two generic versions (named Version #1 and Version #2) in accordance with the present invention pertain to those spintronic oscillators and random-access memories (STT-MRAMs) that rely on a spin-transfer phenomenon to exert torque on the spontaneous spin moment of a metallic monodomain free magnet.

As readily apparent to the skilled artisan, STT-MRAM is an abbreviation for "spin transfer torque magnetic random access memory." As noted above in the background section, in prior art, electric current that flows through an electrically conducting polarizing magnet generates the spin current whose absorption gives rise to a torque in the free magnet.

Instead of electricity, several devices in accordance with the present invention rely on the flow of heat through an electrically resistive polarizing magnet (also referred to herein as a magnonic polarizer), to generate the spin current that creates the needed torque. In an illustrative aspect of the present invention, dubbed magnonic (or equivalently thermagnonic) spin-transfer (MST), an externally provided electric current may create the necessary heat by means of Joule heating (also called Joule effect, ohmic heating or resistance heating). However, it is the flow of this heat energy carried by magnons in several aspects of the invention, rather than the electric current carried by electron movements known in prior art, which physically excites the flow of spin-polarization from within the magnonic polarizer. This change in operation provides an increase, over prior art, of the spin-transfer torque per unit electric current supplied in the device, making it possible for an oscillator or a spintronic memory cell in accordance with this invention to function with some combination of smaller drive current, greater oscillator frequency, and/or greater writing speed. In addition, several aspects of this invention increase the opportunity for favorable scaling of devices relying on spin transfer. Scaling an oscillator in accordance with this invention, to greater size increases its power output; scaling an STT-MRAM cell in accordance with this invention, to smaller size increases the memory density.

In some aspects of the invention, the invented magnonic spin-transfer (MST) method of creating magnetization torque uses a stack of five material elements or layers contributing specific functions. In both Versions #1 (see stack 110 in FIG. 1A) and #2 (see stack 120 in FIG. 2A) of MST, an element 111 called a heater is located at one extremity (e.g. top) of this stack. An externally powered source creates heat that flows from this heater 111 in sequence through the remaining layers of the stack. Our terminology "heater" may include a thermal barrier to prevent flow of heat away (upward in FIGS. 1A-1C, 2A-2C, 3B and 4B) from the remainder of the device, if the use of the invention needs it.

In some structures in devices in accordance with the invention, a structure in the form of a stack is formed of layers although as will be readily apparent in view of this disclosure other structures also in accordance with the invention use elements which do not have the form factor of layers but are formed of the same materials as the layers. Hence, depending on the aspect of the invention, two or more such elements may be positioned relative to one another so as to interoperate in a manner similar or identical to operation of corresponding layers described herein. Accordingly, although some description of various devices below refers to one or more layers, it is to be understood that corresponding one or more elements are similarly used in several such devices that are also contemplated by the inventor as being in accordance with the invention.

In Version #1 (see FIG. 1A) of magnonic spin transfer, said heat flows from the heater 111 down into the second layer 112, the said electrically resistive ferro- or ferri-magnet serving as magnonic polarizer. In such a magnet 112, each quantized spin excitation, called a magnon, carries a quantum of heat energy together with a quantum of electron spin that is polarized oppositely to the spontaneous spin moment of the magnet. These heat and spin currents continue through the third layer 113, a normal non-magnetic metal spacer, in which atomically unbound electrons freely carry both the heat and spin currents. Both heat and spin currents continue into the fourth layer 114, the said metallic free magnet. Absorption of this spin current by the free magnet 114 creates the desired spin-transfer torque acting on its spin moment.

The torque, thus created by MST, excites the magnetic moment of the free magnet 114 into the precessional oscillation that provides the oscillator or memory-write functions similar or identical to corresponding functions described in the prior art for current-driven spin transfer. The fifth and last layer 115 of said stack 110 is thermally conductive and sufficiently bulky to disperse the heat flowing into it without substantially impeding the heat flow or adversely affecting other circuit elements that may be present nearby. In one illustrative example in accordance with the invention, a silicon substrate normally used in manufacturing of structures in integrated circuits is included in the fifth element 115 of stack 110. In another illustrative example in accordance with the invention, substrate of metal is included in the fifth element 115 of stack 110.

Hence, a stack 110 in several devices of the invention includes a heat sink having greater thermal conductance than the electrically resistive material in the second layer 112. Depending on the embodiment, the heat sink 115 is located in direct thermal contact with at least one of electrically resistive material in layer 112 (see FIG. 2A), the electrically conductive material in layer 114 (see FIG. 1A), and the spacer formed by layer 113 (not shown).

Note that electric current plays no inherent role in the above description of magnonic spin transfer. In several aspects of the invention, any spin current that might be associated more directly with some electric current existing in a particular use of MST contributes less in order of magnitude to the torque on the moment of the free magnet 114; the present description of MST neglects it (the torque).

Version #2 (see stack 120 in FIG. 2A) of the magnonic spin-transfer in some aspects of the invention uses material layers just like those of Version #1 described above (see stack 110 in FIG. 1A). However, these layers are arranged in a different order. In Version #1, heat flows first through the magnon polarizer 112, then through the free magnet 114 (see FIG. 1B). However, the different order of the layers in Version #2 provides heat flow first through the free magnet 114, then through the magnon polarizer 112, as depicted in FIG. 2B. The difference between Versions #1 and #2 in order of polarizer 112 and free magnet 114 causes a difference in the direction of torque on the moment of the free magnet 114, for the same material compositions.

Although a free magnet has been described above as being metallic, any material that is electrically conductive and possess spontaneous magnetization (or residual magnetization) may be used as a free magnet in various devices in accordance with this invention. In numerous such devices, the above-described polarizing magnet (or magnonic polarizer, or magnon source) is formed of a material that possesses spontaneous magnetization, but this magnetic material is electrically resistive in bulk (at least relative to the electrically conductive material used in the free magnet). In some aspects of the invention, a magnetic material that is included in the polarizing magnet has an electrical conductance therethrough that is negligible (e.g. three or four orders of magnitude lower) relative to the electrical conductance through the free magnet.

A magnetic material that is included in the polarizing magnet is selected (by design) to have an electrical conductance that is sufficiently negligible to ensure that all (or almost all, or most, or majority, or substantial amount, depending on the aspect of the invention) of the heat energy transferring between the spacer and the polarizing magnet is carried by magnons, rather than by electron movement. Thus, as will be readily apparent in view of this disclosure, various polarizing magnets in accordance with this invention may have varying amounts of electrical conductance, and various devices in accordance with the invention that use such polarizing magnets have varying degrees of effectiveness when using heat (instead of electric current) to transfer magnetization direction from the polarizing magnet to the free magnet.

In several aspects of the invention, the polarizing magnet and the free magnet do not touch each other and instead, a spin current is transferred therebetween via a spacer as described above. Although a normal metal spacer is described above, a spacer that is used in many devices in accordance with this invention may include any material (such as copper) that is diamagnetic, i.e. having no unpaired spins, e.g. wherein for each electron having an up spin, there exists another electron that has a down spin. As will be readily apparent in view of this disclosure, spacers in accordance with this invention may include, in addition to a diamagnetic material, varying amounts of one or more impurities (e.g. embedded therein) and such impurities may have electrons with unpaired spin. Therefore, some devices in accordance with the invention that use spacers with impurities have varying degrees of effectiveness in transferring therethrough the spin current (and thus the magnetization direction).

In several aspects of the invention, each of the two illustrative, here invented device Uses (#1 and #2) of the said MST method (i.e. stacks 110 and 120) requires the incorporation of a sensor which may be similar or identical to a corresponding sensor described in the prior art (see Background section above), namely a tunnel barrier separating a free metallic magnet from a second metallic magnet having a static moment vector. In addition, in some aspects of the invention, each Use incorporates a tunneling heater and thermal barrier available in the prior art for thermally assisted memory (TA-MRAM).

Figure 8A:
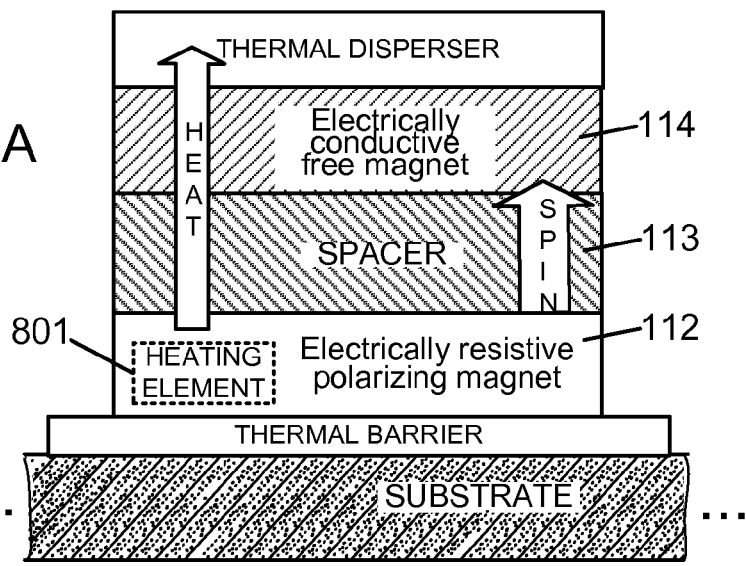
FIGS. 8A-8C illustrate, in cross-sectional views, alternative locations for a heating element in accordance with the invention.

Depending on the aspect of the invention, such a heater is positioned in a structure in accordance with the invention so as to transfer heat at least between the spacer and the electrically resistive material. Moreover, in some aspects of the invention, the thermal barrier has a smaller thermal conductance than at least the electrically resistive material 112 (see FIG. 8A).

Illustrative devices in certain aspects of the invention include a tunneling heater of the type described in U.S. Pat. No. 6,385,082 granted to Abraham et al, entitled "Thermally-assisted magnetic random access memory (MRAM)" which is incorporated by reference herein in its entirety. Several aspects of the invention include a sensor of the type described in, for example, U.S. Pat. No. 7,411,817 granted to Nozieres et al entitled "Magnetic memory with a magnetic tunnel junction written in a thermally assisted manner, and method for writing the same" which is incorporated by reference herein in its entirety. Additionally, in some aspects of the invention, such illustrative devices include a thermal barrier (e.g. containing Tantalum), of the type described by Papusoi et al, in *New Journal of Physics* 10 103006 (2008), an article entitled "Probing fast heating in magnetic tunnel junction structures with exchange bias" which is incorporated by reference herein in its entirety.

In certain aspects of the invention, Use #1 in an oscillator (see FIGS. 3A-3B) combines Version #2 of MST (see FIG. 2A) with elements taken from prior art. See, for example, U.S.

Pat. No. 7,411,817 granted to Nozieres incorporated by reference above. Various prior art for said TA-MRAM supplies the entire pillar 310 in the form of a circular cylinder (see FIG. 3C). Within this pillar 310 (see FIG. 3B), the antiferromagnet 311 pins the moment of the "pinned metallic magnet" 312 in some fixed horizontal direction making the prior-art sensor 313 sensitive to one horizontal component of the moment of the free magnet 314. The tunnel-bather component 315 of this pillar 310 serves as the heater element 111 (see FIG. 2A) required in Version #2 of MST of some embodiments of the invention. The thermal barrier 316, known in the prior art for TA-MRAM, prevents heat from flowing upward, thus insuring that most of it flows downward into the remainder of the device 300 (see FIG. 3B). The free magnet 314 of prior sensor art, located at the bottom of the cylindrical pillar 310, has uniaxial magnetic anisotropy energy with an easy horizontal plane and serves as the second layer 114 (see FIG. 2A) of MST Version #2 in several aspects of the invention.

Note that all directions described herein, such as "bottom" in the previous paragraph, as well as "below", "vertically", and "upward" in the next paragraph, are being described relative to an orientation of a device shown in a corresponding figure attached hereto that is being described herewith.

In several aspects of the invention, the portion of the oscillator structure 300 (see FIG. 3B) that lies below the cylindrical pillar 310 includes the three remaining layers 317-319 required by Version #2 of MST (e.g. stack 120 in FIG. 2A). The lateral dimensions (e.g. width and length) of these remaining layers 317-319 may be greater than the diameter of the pillar (e.g. see Dp in FIG. 3B, which may be, for example, 100 nm). Of these three remaining layers, the "base electrode" layer 317 serves as the "normal metal spacer" (third layer 113) of MST Version #2. The "pinned resistive magnet" (see layer 318 in FIG. 3B) has its remanent spin moment directed vertically and serves as the "magnonic polarizer" (fourth layer 112) of MST Version #2. This upward direction of spin moment provides an upward component of spin-transfer torque to the spin moment of the free magnet 314 when heat flows from the tunnel bather 315 (acting as a heater) through the free magnet 314. Finally, the "silicon CMOS substrate" 319 provides the thermal-dispersion element (fifth layer 115) included in MST. In addition, this substrate 319 includes the prior-art integrated circuitry (not shown) necessary for operation of the oscillator.

Figure 2B:
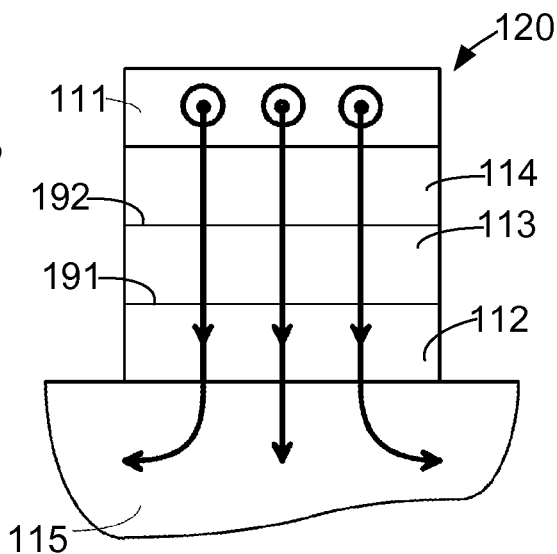
FIGS. 2B and 2C respectively illustrate flow of heat and spin through stack 120 of FIG. 2A.
Figure 3A:
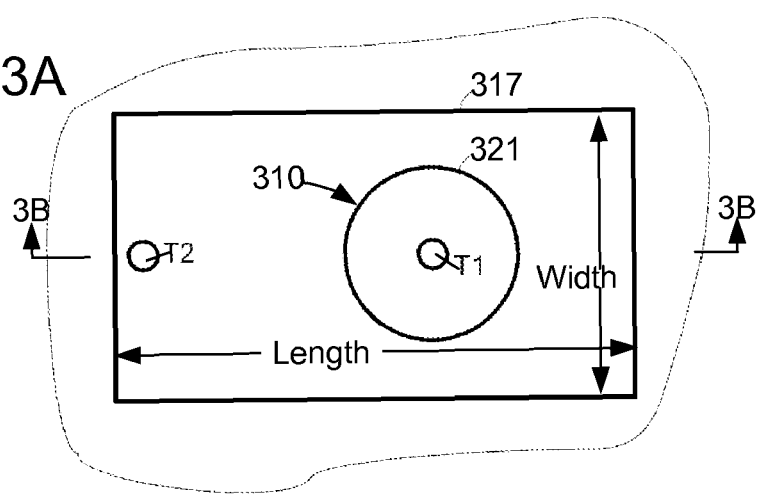
FIGS. 3A and 3B illustrate, in a plan view and a cross-sectional front view respectively, an oscillator in some aspects of the invention, in the respective directions 3A-3A (in FIG. 3B) and 3B-3B (in FIG. 3A).
Figure 3B:
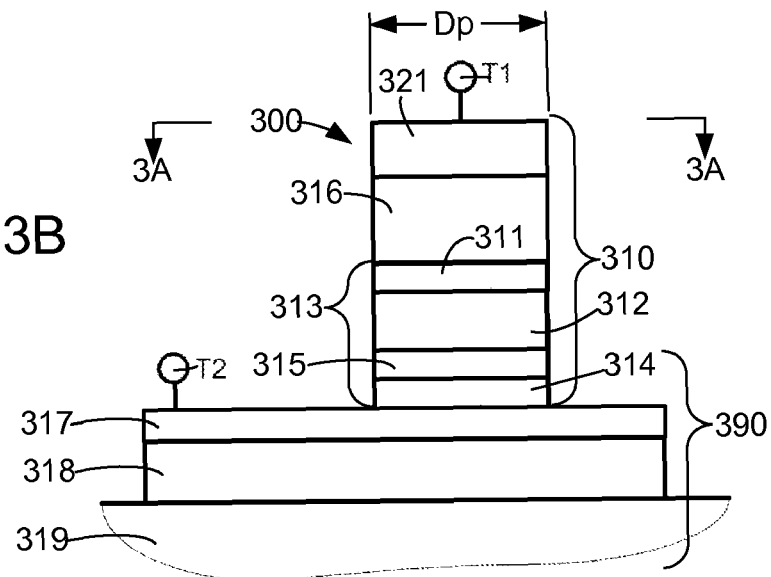

In some aspects of the invention, operation of oscillator 300 shown in FIG. 3B requires the supply from the CMOS substrate (see item 319 in FIG. 3B) of a steady electric current through device 300, between terminals T1 and T2. Note that in the illustrative device shown in FIG. 3B, a terminal T1 that is external to oscillator 300 is coupled to electrode 321 (also called "pillar" electrode) of pillar 310 while another such externally-accessible terminal T2 is coupled to base electrode 317 (described above). This current serves two functions: One function is to power the said prior-art tunneling heater 315, which supplies, by MST Version #2 (see FIG. 2B), the torque that sustains precession of the moment of the free magnet 314 (see FIG. 3B). Its second function is to bias the magnetic tunnel junction 300 so that, as known from prior art for magnetic tunnel junction sensors, the desired oscillating component of output voltage created between the said pinned and free metallic magnets 318 and 314 appears between external terminals T1 and T2 (see FIG. 3A).

Use #2 of MST provides the write operation in a rectangular MRAM array 400 (see FIG. 4A) arranged in rows and columns of memory cells. Any one such cell (see cell 410 in FIGS. 4A and 4B) contains Version #2 of here invented MST together with prior-art features including a heater 411 with thermal barrier 412, magnetic-tunnel junction sensor 413, and reversal of polarizer moment by means of a current-induced magnetic field.

Figure 4A:
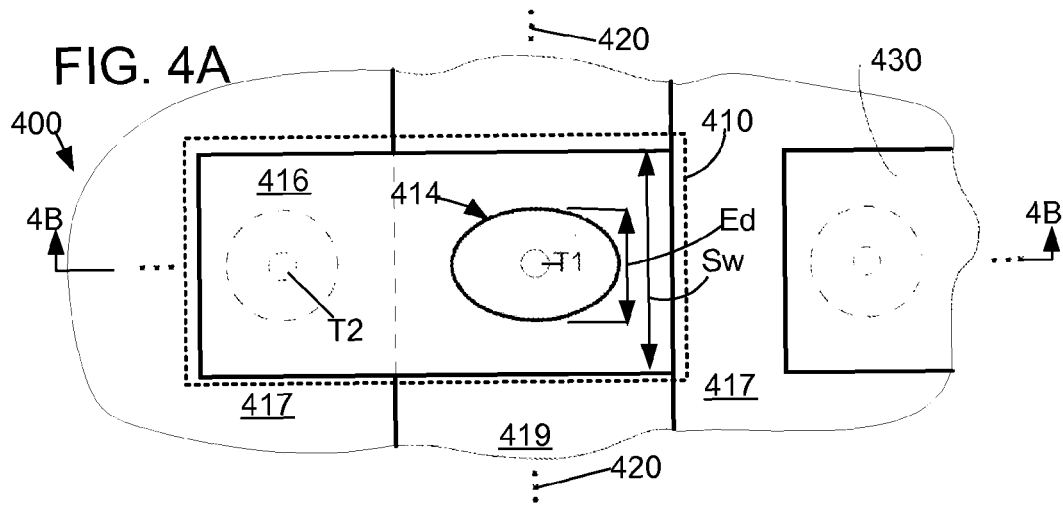
FIGS. 4A and 4B illustrate, in a plan view and a cross-sectional front view respectively, a portion of a memory in some aspects of the invention, in the respective directions 4A-4A (in FIG. 4B) and 4B-4B (in FIG. 4A).
Figure 4B:
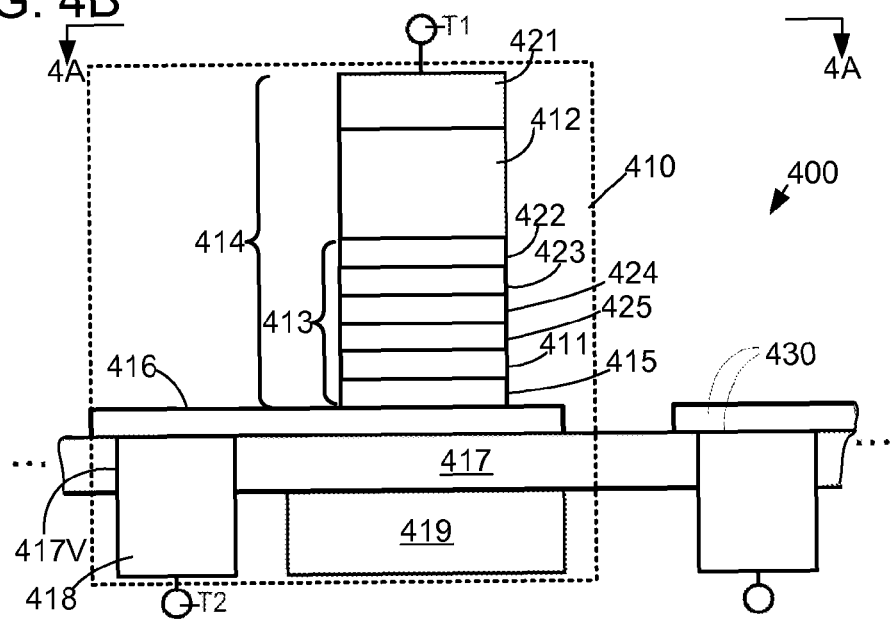

The pillar 414 indicated in FIG. 4B has an elliptic cross-section. It contains said thermal barrier 412 insuring that most of the Joule heat created by electric current flowing through the tunnel-barrier heater 411, which forms a part of the magnetic-tunneling sensor 413, flows downward (relative to FIG. 4B) through the remainder of the memory cell 410. Thus said tunnel barrier 411 (see FIG. 4B), together with the said thermal barrier 412, serve as the "heater" that is the first element 111 of MST Version #2 (see FIG. 2A). The free magnet 415 at the bottom of said pillar 414 is its second element 114. It (free magnet 415) stores one bit of data, 0 or 1, represented by the two stable magnetization directions along a major axis of the elliptic cross-section (of pillar 414).

A "short metal strip" 416 (see FIG. 4B) that serves as the "normal metal spacer" (third layer 113) of MST Version #2 (see FIG. 2A) supports the said elliptic pillar 414 of each memory cell 410 such as the one shown in FIG. 4B. Beneath the many short metal strips (see 416 in FIGS. 4A, 4B) present in the memory array 400 lies the nearly continuous "resistive magnet" 417 that serves as the magnonic polarizer (fourth layer 112) of Version #2. The vertical "cylindrical electrode" 418 threads the via hole in said resistive magnet 417 to provide electric connection between the said short metal strip 416 of each cell and the CMOS substrate (not shown); aside from such via holes, the polarizer 417 is continuous underneath the entire memory array. These via holes include one hole for each memory cell in order to connect terminal T2 to its assigned selecting transistor or diode present within the CMOS or other semiconductor chip that supports the entire memory array 400. The "long metal strip" 419 that lies under a column of data cells (shown by dots along a vertical line 420 in FIG. 4A) extends in a direction orthogonal to the plane of the front view in FIG. 4B. The said long metal strip 419 serves as the thermal disperser (fifth layer) of MST (see FIG. 2A) in some aspects of the invention.

Figure 4C:
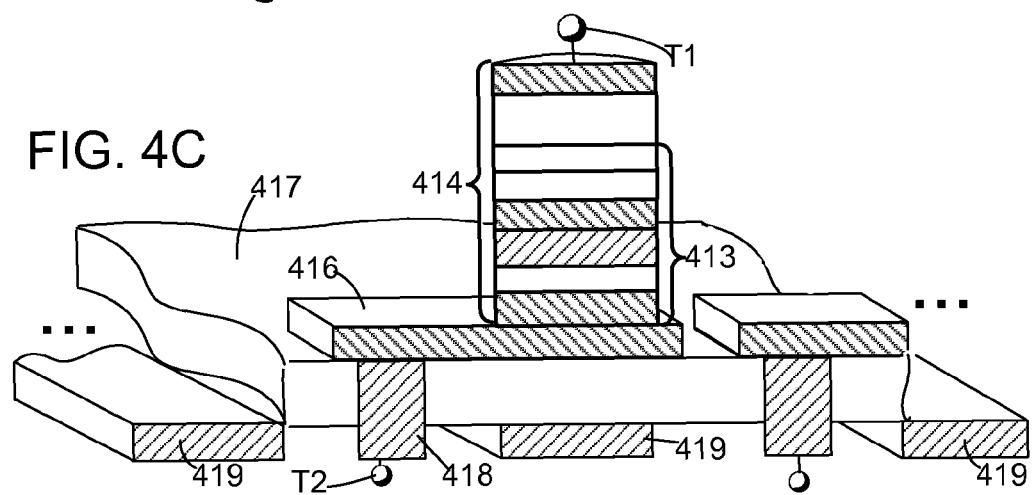
FIG. 4C illustrates in a cross-sectional perspective view, the memory portion of FIGS. 4A and 4B.

To write a single bit of data into the memory cell illustrated in FIGS. 4A-4C, one provides a pulse of electric current I1 through the said long metal strip 419. This current induces a magnetic field that orients the moment vector of that portion of the resistive magnet 417 that lies directly underneath the column of data cells 420 that includes this cell 410. The resulting moment direction, either one of two directions that depends on the sign of current I1, determines whether a 0 or 1 data bit is to be written. To complete the write operation, a prior-art transistor or diode that is located in underlying CMOS (not shown) and is connected to terminal T2, selects the cell 410 by causing a current pulse I2 that overlaps I1 in time, to flow between terminals T1 and T2, thus powering the heater 411. The resulting flow of heat switches the free magnet 415 in accordance with Version #2 of magnonic spin transfer (see FIG. 2B). Subsequently, the bit of stored data may be read by means of a weaker current flowing between terminals T1 and T2 of the magnetic-tunnel-junction sensor.

Next are described essential elements and workings of the two Versions, #1 and #2 (see FIGS. 1A-1C and 2A-2C), in some aspects of magnonic spin-transfer (MST) in accordance with the invention. Then are described alternative uses of the MST in several aspects of the invention, namely a spintronic oscillator device (see FIG. 3B) and a cell of random-access magnetic memory (see FIG. 4B). Each of these two versions of MST (see FIGS. 1A-1C and 2A-2C) has five functioning layers 111-115 that include an unspecified externally powered heater. To create heat, one may use Joule heating due to an electric current, or a focused electron beam, or a focused light beam, or a nanoscopic light-emitting diode (FIG. 9C), or sliding friction, or a chemical reaction such as combustion.

FIG. 1A illustrates version #1 of MST stack 110 in some aspects of the invention, specifying the direction of heat flux F from the magnonic polarizer 112 to the free magnet 113 that receives the transferred spin momentum. As noted above, the sequence of five layers in FIG. 1A consists of heater 111, magnonic polarizer 112, normal metal spacer 113, free magnet 113, and thermal disperser 114. In many aspects of the invention, neighboring elements (e.g. polarizer 112 and spacer 113) have ionic bonds to one another, in order to ensure easy heat flow therebetween. The thicknesses of these layers shown in FIG. 1A are not drawn to scale. In several such aspects of the invention other neighboring elements (e.g. free magnet 114 and spacer 113) have metallic bonds to one another. If a semiconductor material is used in an element of a device in accordance with the invention, such an element may have covalent bonds with another element in the device.

Here follows a description of these five layers in several aspects of the invention. In FIG. 1A, the said heater 111 connects directly to a magnonic polarizer 112. In certain aspects of the invention, the "magnonic polarizer" used in FIG. 1A means a ferromagnet or ferrimagnet having a spontaneous magnetization and sufficient electric resistance that the flux of heat carried by movement of conduction electrons constitutes none or only a minor part of the entire heat flux. In some aspects of the invention, magnetic quantum excitations known in physics as magnons carry a major portion of the heat through said magnonic polarizer 112. Therefore, the metallic elements or alloys commonly used as (electric) spin polarizers in the prior art for spin transfer are not suitable (in some aspects of the invention) because electron motions, rather than magnons, transport most of the heat through them.

Preferred alternative compositions for an in-plane magnetized magnonic polarizer 112 include the insulating polycrystalline ferrites having the compositions meghamite $\gamma Fe_2O_3$, manganese-magnesium ferrite $(Mn,Mg)Fe_2O_4$, lithium-iron ferrite $Li_{0.5}Fe_{2.5}O_4$, lithium-zinc ferrite $(Li,Zn,Fe)_3O_4$, yttrium iron garnet $Y_3Fe_5O_{12}$, yttrium-gadolimium iron garnet $(Y,Gd)_3Fe_5O_{12}$, and nickel ferrite $NiFe_2O_4$. In several aspects of the invention, the just-described compositions in this paragraph are included in fixed magnets that are used to implement memory cells of the type described herein.

Preferred alternative compositions for a plane perpendicular magnetized magnonic polarizer 112 include the c-axis textured insulating compositions barium hexaferrite $BaFe_{12}O_{19}$, barium gadolinium-iron hexaferrite $Ba(Gd,Fe)_{12}O_{19}$, and aluminum-iron hexaferrite $Ba(Fe,Al)_{12}O_{19}$. In several aspects of the invention, the just-described compositions in this paragraph are included in fixed magnets that are used to implement oscillators of the type described herein.

Every one of the magnetic ions ($Mn^{2+}$, $Fe^{3+}$, $Gd^{3+}$) present in each of the said preferred alternative compositions of the magnonic polarizer 112 in some aspects of the invention has the orbital quantum number L=0. Consequently, each preferred composition has weak spin-phonon relaxation. Therefore, these ferrites communicate little heat between these ionic spins and the phonons whose thermal conductance would otherwise weaken the desired spin transfer.

In FIG. 1A, the term "normal metal spacer" denoting the third layer 113 means (in several aspects of the invention) a good electrical conductor, such as copper or silver, which contains no atomic spin moments to cause spin relaxation. The term "free magnet" specifying the fourth layer 114 is well known in the prior art for spin-transfer magnetic oscillators and random access memories (STT-MRAMs) as an element or alloy that includes at least one of the elements Fe, Co, Ni, and, in addition perhaps B (boron). The term "thermal disperser" denoting the fifth and lowest layer 115 means a material like silicon or any metal having a high thermal conductivity. In addition, the thermal disperser 115 is thicker and has at least one large (e.g. an order of magnitude large) horizontal dimension relative to those of the free magnet 114 in order to disperse efficiently the heat created by the heater 111 without significantly affecting other devices that might be in contact with it.

Figure 1B:
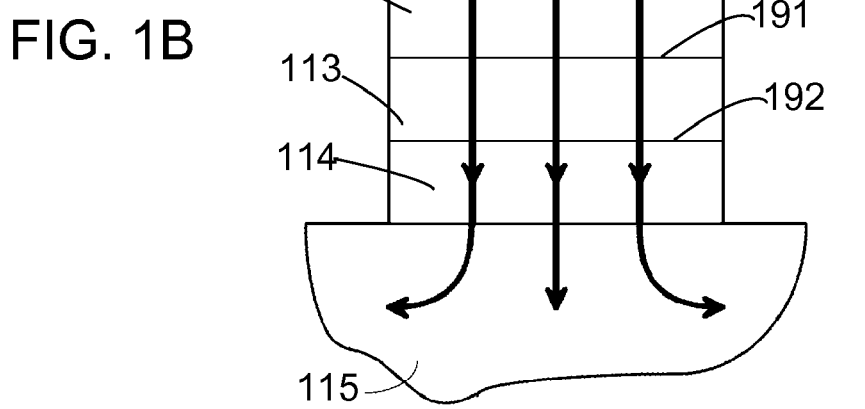
FIGS. 1B and 1C respectively illustrate flow of heat and spin through stack 110 of FIG. 1A.

In several aspects of the invention, to perform a magnonic spin-transfer function, one applies either a single pulse of heat or a steady heating by means of the said heater 111. As a result, heat flux in amount F, here considered steady, flows through the entire device 110 (or 120) from the heater 111 into the said thermal disperser 115, as depicted in FIGS. 1B and 2B.

Figure 1C:
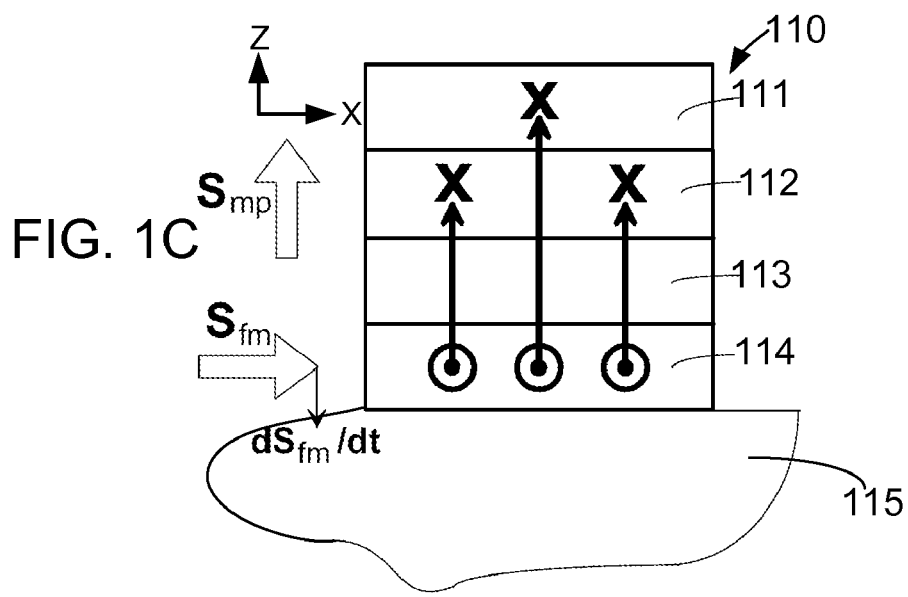

Referring to FIG. 1C, consider a Cartesian axis z along the direction of the spontaneous electronspin moment vector Smp of the said magnonic polarizer 112. Although Smp and axis z appear oriented vertically upward in FIG. 1C, depending on the aspect of the invention, they may actually take any common direction in three dimensions with respect to the depicted five-layer device geometry of device 110 (or device 120). Passage of this heat flux through the interface 191 (see FIG. 1A) between the magnonic polarizer 112 and the said normal metal spacer 113 annihilates incident magnons and transfers their z-component of quantized electron spin, having the negative Planck amount $h/2\pi 32\ 1.05\times 10^{-34}$ Js, to the electrons in the normal metal spacer. This transfer of spin component to the normal metal spacer 113 creates a condition known in physics as spin accumulation that, in the xz-space of FIG. 1C, has negative algebraic sign along the z-axis.

As understood from the prior art for certain devices using spin transfer driven by electric current, this spin accumulation driven by heat in the present invention stimulates the positive flow $Q_z$ (>0) of z-component spin momentum indicated schematically by the vertical arrows inside the device shown in FIG. 1C. Boldface characters "X" shown within the heater 111 and magnonic polarizer 112 regions indicate that thermal relaxation of spin polarization within one or both of them replenish the magnons and their spins emitted, as described above, into the polarizer-metal interface.

While heat is flowing, the said free magnet 114's spin moment $S_{fm}$ may take a range of instantaneous directions in three dimensions. For convenience of description, FIG. 1C shows only the special instant that $S_{fm}$ lies along the Cartesian x-axis orthogonal to Smp. In this special case, the free-magnet moment fully absorbs the negative of the component $Q_z$ of spin momentum current impinging on it, as indicated by the boldface character "O" seen in FIG. 1C. The result is that the z-component of $S_{fm}$ acquires a time derivative $dS_{fm,z}/dt=Q_z$, interpretable as a downward effective spin-transfer torque $\tau=dS_{fm}/dt$ on free-magnet spin vector $S_{fm}$ indicated in FIG. 1C.

For a general angle $\theta$ (see FIG. 5B) between $S_{fm}$ and $S_{mp}$, the magnitude of said torque is given by the relation $|dS_{fm}/dt|=|Q_z \sin\theta|$. Just as in the prior art for spin transfer driven by electric current, in many aspects of this invention said torque excites the free-magnet moment to effect its precession about an axis of magnetic anisotropy. The use of MST in an oscillator in some aspects of the invention described below requires that this precession is steady. In its use in a memory cell also described below for several aspects of the invention, this precession of $S_{fm}$ is transient, leading ultimately to switching of the moment between two directions representing two information states.

FIG. 1C indicates that the direction of torque $dS_{fm,z}/dt=-Q_z$ tends to orient the said moment $S_{fm}$ into the direction opposite to said polarizer moment $S_{mp}$. We call this Version #1 case of MST divergent. In the present Version #1 with heat flow direction from magnonic polarizer 112 to free magnet 114, the torque must be divergent in several aspects of the invention.

Figure 2A:
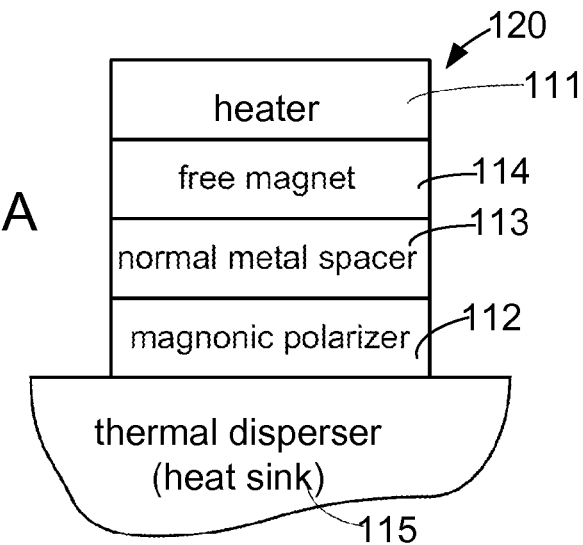
FIG. 2A illustrates another stack 120 in accordance with the invention that also includes magnets 112 and 114 and spacer 113 arranged in a different order relative to the order shown in FIG. 1A.

FIG. 2A illustrates a structure that uses Version #2 of MST in some aspects of this invention. FIG. 2B depicts the direction of heat flux F from the free magnet 114 to the magnonic polarizer 112 in the structure of FIG. 2A. The above discussion of Version #1 (see FIGS. 1A-1C) already described its same five component layers 111-115 (see FIGS. 2A-2C). In the aspects of the structure illustrated in FIGS. 2A-2C, Version #2 has the new sequence: heater 111, free magnet 114, normal metal spacer 113, magnonic polarizer 112, and thermal disperser 115.

Figure 2C:
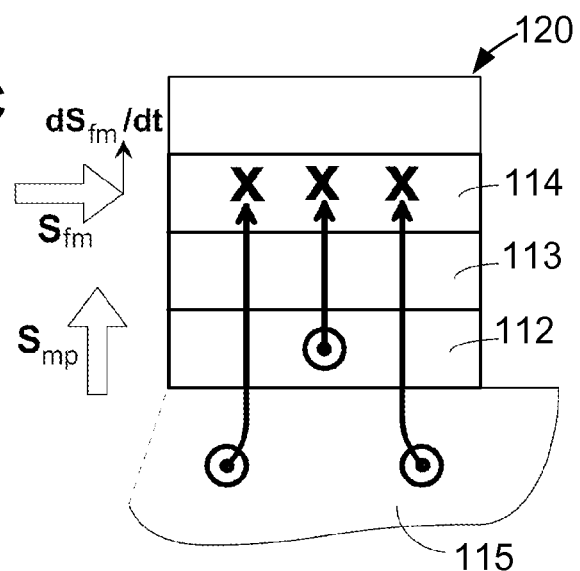

FIGS. 2B and 2C, like FIGS. 1B and 1C, depict heat flow and spin-momentum flow, respectively. In this case the spin-transfer torque tends to align the said moment $S_{fm}$ into the same direction as the said polarizer moment $S_{mp}$. Hence this Version #2 of thermagnonic spin transfer is termed convergent.

In several aspects of the invention, the operation of magnonic spin transfer in Version #2 differs from that of Version #1 in the following ways: referring to FIG. 2C, flow of heat across the interface 191 between the magnonic polarizer 112 and normal metal spacer 113 creates spin accumulation in the normal metal spacer 113. In some aspects of the invention, the resulting spin-chemical potential difference across this interface 191 draws spin polarization out of the magnonic polarizer 112 and thermal disperser 115 by inverse relaxation indicated in FIG. 2C by the character O, and drives the spin-current component $Q_z$ flowing from the disperser 115 to the free magnet 114. The moment of the free magnet 114 absorbs this spin current to create apparent torque in such aspects of the invention. As indicated, in certain aspects of the invention, the torque direction is convergent; it tends to align the free magnet moment $S_{fm}$ with that of a ferromagnetic magnonic polarizer $S_{mp}$. Depending on the aspect of the invention, such a torque may drive magnetic dynamics in an oscillator or a memory cell just as in the case of Version #1.

In the prior art for spin-momentum transfer driven directly by electric current, the occurrence of dynamic convergence versus divergence of the two magnetic moments varies with the sign of the driving current.

In the case of magnonic spin-momentum transfer in many aspects of the invention, interchanging relative locations of the polarizer and free magnet (Versions #1 ↔ #2) results in convergence replacing divergence for a given set of material compositions.

Depending on the aspect of the invention, those skilled in the art may combine some of the five element functions of MST with functions pertaining to other device features, taking care to preserve the sequence of (two or more elements illustrated in) either Version #1 or Version #2. Additionally, they may insert additional elements having different functions among those of MST, as dictated by the intended usage. Such insertions are subject to two provisos either alone or in combination depending on the aspect of the invention. The first proviso is that the additional elements do not substantially impede the flow of heat between the heater 111 and the thermal disperser 115. The second proviso is that the normal metal spacer 113 must remain in chemically bound contact with both the magnonic polarizer 112 and the free magnet 114 in order to insure unimpeded flow of spin current between them. The exemplary uses of MST described below illustrate such liberties of device design in various aspects of the invention.

Figure 3C:
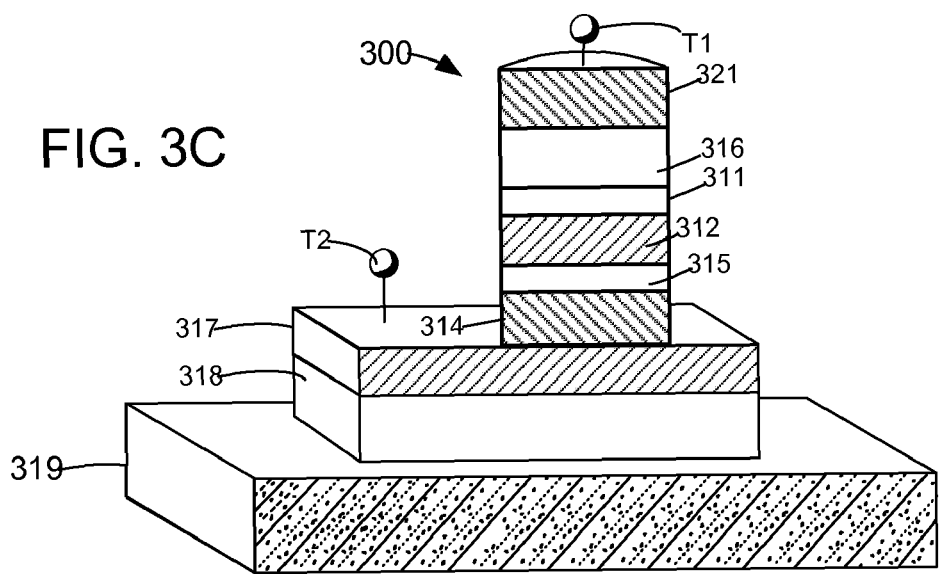
FIG. 3C illustrates in a cross-sectional perspective view, the oscillator of FIGS. 3A and 3B.

Refer to FIGS. 3A-3C. In several aspects of the invention, an invented oscillator device 300 has three connected geometric parts (1)-(3) as follows. These parts are 1) a cylindrical pillar 310 of circular cross-section visible in the plan view (FIG. 3A). Its diameter Dp is about 100 nm. The front view (FIG. 3B), in which the element thicknesses are not to scale, shows how this pillar 310 rests vertically on 2) a base 317 in the form of a rectangular parallepiped one or both of whose lateral dimensions (width and length shown in FIG. 3A) exceed the diameter Dp of the cylinder 310. This base 317 rests on 3) an even larger heat disperser 319 that may include a number of various integrated devices using Si technology such as CMOS.

Said pillar 310 (FIG. 3B) in total is adapted from the prior art for a memory cell that uses elevation of temperature to temporarily lower the energy barrier due to magnetic anisotropy or exchange pinning of a free magnet in order to allow its moment to switch in a modest applied magnetic field (as described in U.S. Pat. No. 7,411,817).

In several aspects of the invention, said pillar 310 is composed of six elements visible in the front view shown in FIG. 3B. In downward sequence, these elements are electrode 321 connected to terminal T1, thermal barrier 316, antiferromagnet 311, pinned metallic magnet 312, tunnel barrier 315, and free magnet 314. The antiferromagnet 311 pins the magnetic moment of the pinned magnet 312 along a horizontal direction so that the magnetic tunnel junction (formed by pinned magnet 312, free magnet 314 and tunnel barrier 315) senses an alternating voltage proportional to this same horizontal component of the precessing moment of the free magnet 314.

Said pillar 310 already includes two of the five layered elements that comprise a Version #2 device (see FIG. 2A) of MST in some aspects of the invention. Firstly, the tunnel barrier 315 together with thermal barrier 316 comprise the heater 111 of MST; when electric current flows through the pillar 310 (FIG. 3B) from terminal T2 to terminal T1, electrons tunnel quantum-mechanically at high voltage (circa 1 Volt) through the barrier 315, thus depositing heat energy into the free magnet 314. The said thermal barrier 316 resists upward heat flow, thus insuring that most of this generated heat flows downward into the free magnet 314 as required for MST (see FIGS. 2A and 2B). Secondly, this free magnet 314 (FIG. 3B) at the bottom of the pillar 310 constitutes the second element 114 of MST.

The front view in FIG. 3B also shows the three remaining elements of magnonic spin transfer that lie below the pillar 310, in certain aspects of the invention. Uppermost is the base electrode 317 (FIG. 3B) that serves as the normal metal spacer 113 (FIG. 2A) of MST. In some aspects of the invention, at least one lateral dimension of the base electrode 317 exceeds the diameter of the pillar 310 in order to provide external electric access to the pillar 310 through terminal T2. Additionally, in several aspects of the invention, this base electrode 317 is thin enough (10 nm or less) to limit (or reduce) heat loss in a lateral direction.

Under the base electrode 317 lies the pinned resistive magnet 318 (e.g. of thickness circa 10 nm) serving as the magnonic polarizer 112 of MST. It may have the same lateral dimensions as the base electrode 317. In order to provide a large torque on the free magnet 314 this polarizer 318 is best a non-metallic ferrimagnet in many aspects of this invention. For example, deposition of c-axis vertically textured crystalline barium hexaferrite $BaFe_{12}O_{19}$, followed by application of sufficient vertical magnetic field, will pin the moment vertically in a magnetically remanent state, in a manner similar or identical to prior art.

Finally, the device 310 includes the extended heat disperser 319 that consists of Si-based CMOS electronics similar or identical to prior art, and that may support a large number of integrated electronic and/or spintronic devices, e.g. in an integrated circuit.

Both views in FIGS. 3A and 3B show terminals T1 and T2 providing external electric access to the said pillar 310. Electronic control circuitry within the silicon substrate 319 supplies, through leads which are not shown, constant electric current flowing from terminal T2 to terminal T1. In numerous aspects of the invention, a majority of the resulting heat flow generated by the tunnel bather 315 flows downward through all five of the elements 111, 114, 113, 112 and 115 of Version #2 of MST. As described above, this heat flow creates a torque τ on the spin moment of the free magnet 314. This torque τ excites precession of the free-magnet moment vector about the vertical axis, through pillar 310 in FIG. 3B. The resulting alternating term of the voltage is sensed between T1 and T2, similar or identical to prior-art for magnetic tunneling sensors, thereby fulfills the purpose of an oscillator 300.

Refer to both plan and front views in FIGS. 4A and 4B. In several aspects of the invention, an invented memory cell has six geometrically distinct parts, as follows: The uppermost of these parts is a cylindrical pillar 414, of elliptic cross-section visible in the top view in FIG. 4A. This pillar 414 has eight elements of prior-art materials (individually described below) that are visible in the front view in FIG. 4B. This front view, in which the element thicknesses are not to scale, shows how this pillar 414 rests vertically on the rectangular short metal strip 416 that extends laterally. Its width Sw may exceed the corresponding minor diameter Ed of the said elliptic cross-section.

The rectangular array (not shown) of said pillars and short metal strips rests on a single element 417 of electrically resistive magnetic material that extends great distances in both lateral directions so that it supports one or more rectangular arrays of memory cells (not shown). A element 419 of long parallel metal strips, like the one shown in both views of FIGS. 4A and 4B, extends orthogonally through the plane of the paper in FIG. 4B and lies under a column of such cells. One vertical cylindrical electrode 418 threads through a via hole 417V in the resistive magnet 417 in order to connect, via terminal T2, said short metal strip 416 with a transistor or diode present in a element of 6) prior-art CMOS circuitry (not shown) that supports all of the memory cells.

In several aspects of the invention, said pillar 414 is adapted from the prior art pillar for a memory cell that uses elevated temperature to lower the energy barrier of a free magnet to switching by a magnetic field. However, the here invented memory cell makes no use of temperature elevation; instead, by means of MST explained above, it uses the flow of heat to create spin-transfer torque τ.

In some aspects of the invention, the said pillar 414 is composed of eight elements visible in the front view of FIG. 4B. In downward sequence, these elements consist of the following: electrode 421 surmounted by terminal T1, thermal barrier 412, antiferromagnet 422, pinned magnet #1 423, normal metal 424, pinned magnet #2 425, tunnel barrier 411, and free magnet 415. The antiferromagnet 422 holds the magnetic moment of pinned magnet #1 423 that in turn pins, by means of negative exchange coupling through the normal metal spacer 424, pinned magnet #2 425 along the major axis of the elliptic cross-section (horizontal in FIGS. 4A and 4B). Consequently, in a manner similar or identical to prior art, any flow of electric current between terminals T1 and T2 causes a voltage that depends on which of the two equilibrium directions, along the major elliptic axis, that the magnetic moment of the free magnet 415 occupies. These two equilibrium directions of the free-magnet moment represent the digital 0 and 1 states of the memory element 410.

In certain aspects of the invention, said pillar 414 visible in the front view of FIG. 4B includes two of the five elements that comprise MST Version #2 described above and illustrated in FIG. 2B. Firstly, the said tunnel barrier 411 and said thermal barrier 412 in FIG. 4B together comprise the heater 111 of MST; when electric current flows through the pillar 414 when flowing from terminal T2 to terminal T1, electrons tunnel quantum-mechanically at high voltage (circa 1V) through the barrier 411, thus depositing heat energy in the free magnet 415. The said thermal barrier 412 prevents upward heat flow, thus insuring that this generated heat flows downward into the remaining elements of MST. Additionally, the free magnet 415 at the bottom of the pillar 415 also constitutes the second element 114 of MST (see FIG. 2A).

In several aspects of the invention, the front view in FIG. 4B shows the three remaining elements of MST lying below the pillar 414. Uppermost is the short metal strip 416 that serves as the normal metal spacer (third element) 113 of MST (see FIG. 2A). Terminal T2 that connects to this strip 416 (see FIG. 4B) via the vertical cylindrical electrode 418 provides, together with terminal T1, the external electric access to the illustrated memory cell 410. Additionally, this electrode strip 416 is thin enough (10 nm or less) to limit heat loss in a lateral direction.

In some aspects of the invention, underneath said short metal strip 416 lies the nearly continuous resistive magnet 417 serving as the magnonic polarizer (fourth element) 112 required for MST (see FIG. 2A). One cause of departure from its continuity is the requirement of one via hole 417V for each cell 410 in order to allow electric connection (not shown) of terminal T1 to the control circuitry in the CMOS substrate at the bottom of the memory plane. To provide a large torque τ on the free magnet 415, in certain aspects of the invention this polarizer 417 is made of a non-metallic composition in order to avoid heat transport via conduction electrons. Preferably, deposition of any of the in-plane magnetically permeable crystalline ferrites said above, in the description of MST, serves this purpose.

Finally, in several aspects of the invention said resistive magnet 417 rests on the set of parallel long metal strips (such as strip 419 in FIG. 4B) that constitute the extended heat disperser (fifth element) 115 of MST (see FIG. 2A) for the whole memory array. Strip 419 in some aspects of the invention is multiple times longer than any dimension of the electrically resistive material in magnet 417, strip 419 being located sufficiently close to magnet 417 such that a direction of magnetization of the magnet 417 is changed on passage of an electrical current through strip 419.

The magnetic shape anisotropy due to the elliptic cross-section of said pillar 414 (FIG. 4A) provides the two easy 0 and 1 equilibrium directions of the free-magnet moment vector along the major elliptic axis (which is horizontal in FIG. 4A, passing through the center of terminal T1).

In various aspects of the invention, writing one bit of data requires application of two overlapping pulsed currents: The first current flows through the long metal strip 419 to induce the magnetization vector of the portion of the magnonic polarizer 417 (see FIG. 4B) that lies under one column of memory cells (see the dotted line 420 in FIG. 4A). The direction of this current determines whether 0 or 1 is subsequently written. A transistor or diode, located in the CMOS substrate and uniquely associated with the selected cell, applies the second current flow between terminals T1 and T2 to excite, by MST, the transient precession of the moment vector of the free magnet 415, which culminates in a switch between 0 and 1 information states. The recorded information state in free magnet 415 is subsequently read in the normal manner, by applying a current pulse from terminal T2 to terminal T1 that is too weak and brief for the switch. The resulting voltage differential across the magnetic tunnel junction 414 senses the 0 or 1 information state.

In prior art, the torque due to transfer of spin momentum is driven by, and is proportional to, an electric current. In the here invented "magnonic" (or, equivalently, "thermagnonic") spin transfer (MST), the torque τ is excited by, and is proportional to, the flux of heat, not electric current. Because heat power due to Joule heating is $RI^2$, this torque τ is proportional to the square of the applied electric current (or voltage) that powers the heater. Due to a square function relationship of heat flux, the magnitude of current used to switch the information state in free magnet 415 is significantly lower (e.g. an order of magnitude lower) than a switching current used in the prior art.

To compare the effectiveness of different spin-transfer torque mechanisms, one may define a numerical quantum torque yield ε characterizing the special case of the spin moment of the free magnet (e.g. magnet 314 in FIG. 3B or magnet 415 in FIG. 4B) lying orthogonal to the pinned spin moment in magnonic polarizer (see magnet 318 in FIG. 3B or magnet 417 in FIG. 4B). To illustrate the meaning of this yield, take first the prior-art spin-transfer torque created in a current-driven magnetic tunneling junction (MTJ). Let Δq be the number of electron charges within a given time interval that tunnel quantum-mechanically through a tunnel barrier (which is included in some but not all embodiments of a heater, e.g. tunnel barrier 315 in FIG. 3B or tunnel barrier 411 in 4B). Next, let Δs be the spin momentum component (in units of Planck constant divided by $2\pi$) consequently transferred orthogonally to the total spin moment of the free magnet (e.g. magnet 314 in FIG. 3B or magnet 415 in FIG. 4B). The formula ε=Δs/Δq defines the quantum torque yield.

Consider first the quantum torque yield of an MTJ having a tunnel barrier between ideal half-metallic ferromagnets. By definition, electrons having only one spin direction are free to tunnel to or from any half-metallic ferromagnet. Suppose that one such electron tunnels through the barrier, giving Δq=1. It transfers its entire spin momentum, contributing the amount Δs=½ to the torque if the moments are orthogonal. The resulting quantum yield is $\epsilon_{mtj}$=½ according to the said definition of ε. The quantum torque yield for an MTJ of any composition cannot exceed this value ½ when using unbound (i.e. free) electrons having only one spin direction, e.g. using ideal half-metallic ferromagnets.

A similar definition of quantum yield serves to characterize thermagnonic spin transfer in the schemes of FIG. 1A and FIG. 2A, as follows. In several aspects of the invention, at the interface 191 between the magnonic polarizer 112 and the normal-metal spacer 113 there exists an atomic monolayer 112M composed of atoms to each of which are bound several 3d electrons. See FIG. 5A, wherein the ferrite 112F and magnetic monolayer 112M together constitute the magnonic polarizer 112. Arrows in FIG. 5A, e.g. in regions labeled ferrite, normal metal, and free magnet indicate directions of spin polarization. Optimally, each atom of this magnetic monolayer 112M consists of an Mn or Fe nucleus with the electron structure $4s3d^5$ outside a closed argon atomic shell, in certain aspects of the invention. These five 3d electrons, all bound to a single Mn or Fe nucleus, form a total spin quantum number S=5/2 and orbital quantum number L=0. Any value of L different from 0 is avoided in some aspects of the invention, because it would engender effects of the spin-orbit interaction which would relax the spin polarization and weaken the spin-transfer effect. Superexchange coupling of the monolayer 112M to the ferrite 112F creates a molecular field K(>0) acting on each of these local spin moments.

Thus, the j-th (with j=1, 2, 3, . . . ) interfacial atom has energy $E_j = -Km_j$ where $m_j$ is the quantized spin component along the axis given by the spin moment of the ferrite 112F. It takes any one of the values $m_j$=−5/2, −3/2, −1/2, +1/2, +3/2, or +5/2. A transfer of spin component from the ferrite to the j-th interfacial moment occurs whenever thermal agitation of this superexchange interaction creates or annihilates a magnon and changes $m_j$ by the amount $\Delta m_j = \pm 1$. Subsequently, the same-site sd exchange interaction within the electron configuration of an atom of the monolayer 112M restores the initial value of $m_j$, while transferring a spin component amounting to $\Delta s = \Delta m_j$ to the non-magnetic spacer. In the formula $\Delta m_j = \pm 1$, the sign (−) holds mostly whenever heat flows from the magnonic polarizer 112 to the free magnet 114 (see FIG. 1A) and the upper sign (+) holds mostly whenever heat flows in the opposite direction (see FIG. 2A). The transfer of heat energy from ferrite to spacer resulting from each such sequence amounts to $-K\Delta m_j$.

To illustrate the spin transfer process, assume that a spinel ferrite serving as item 112F in magnonic polarizer 112 (FIG. 5A) interfaces a spacer 113 of noble-metal (Cu, Ag, or Au) composition. Numerical values of K expected for interfacial magnetic atoms having electron configuration $4s3d^5$ are inferred from a survey of measured properties of spinel ferrites. Consider the examples of ferrites with compositions $NiFe_2O_4$ and $MnFe_2O_4$ having a (100) crystal plane for interface. Values of K estimated from openly published measured properties of ferrites [See, for example, Sections 4.3.1-3 of G. F. Dionne, *Magnetic Oxides* (Springer, New York, 2009)] appear in the second row of Table 1.

TABLE 1

| assumed $G_{Kap}$ | estimated | $NiFe_2O_4$ | $MnFe_2O_4$ |
|---|---|---|---|
| ↓ ↓ ↓ | K (meV) = | 14 | 8 |
| 112 MWm$^{-2}$K$^{-1}$ | $\epsilon_{us}$/V (V$^{-1}$) = | 20 | 14 |
| 45 MWm$^{-2}$K$^{-1}$ | $\epsilon_{us}$/V (V$^{-1}$) = | 35 | 31 |

Now imagine some unspecified heater, having electrical resistance V/I, where I is electric current and V(>0) is the applied voltage. Joule heating creates the steady heat flow F=IV. For example, an MgO tunnel barrier 315 as in FIG. 3B or tunnel bather 411 in FIG. 4B may serve as this heater 111.

Make the following estimate of ε for this case. Consider the hot magnons created by thermalization of the energy provided by one electron falling through the potential V within this heater 315, 411, so that Δq=1. This energy amounts to eV, where e=1.60×10$^{-19}$ coulombs is the magnitude of electron charge. Upon entry into the metal on either side of this barrier 315, 411, the electron collides with unbound conduction electrons already present. After a succession of such collisions, the excess energy of the tunneled electron is shared, in the form of kinetic energy, by a large number of existing conduction electrons. When this heat of amount eV (originating from one electron) flows across the interface 191 (see FIG. 5A) from spacer 113 to ferrite 112F the transfer of energy through each interfacial atom in monolayer 112M is ±K (with the algebraic sign depending on direction of heat flow), according to the above discussion. Therefore, the number of interfacial transitions from the passage of a single electron amounts to |eV/K|. Since each such transition transfers one unit of spin momentum, the spin transfer due to the passage of one electron must now amount to $\Delta s = \pm eV/K$. Taking our above definition ($\epsilon = \Delta s/\Delta q$) of quantum torque yield together with the value $\Delta q = 1$, we have the inherent quantum torque yield $\epsilon_{inh} = |eV/K|$.

The examples of measured ferrite properties shown in Table 1 imply K≈14 and 8 meV for the two ferrite compositions considered. Let us assume the reasonable applied voltage V=300 mV. The above derived inherent yields, corresponding to these two compositions, are $\epsilon_{inh} = |eV/K| = 300/14 \approx 21$ and $300/8 \approx 37$ are more than 40 times the $\epsilon_{mtj} = 1/2$ of an MTJ. The essential insight is that each "packet" e|V| of Joule heat provided by the passage of each electron through the heater 111 (FIG. 5A) is capable of the great number (e|V|/K) of spin transitions, each involving one unit of spin momentum. Counterintuitively, the smaller the amount of transferred energy K, then the greater is this inherent quantum yield $\epsilon_{inh}$ of torque.

In practice the full amount of inherent yield $\epsilon_{inh} = |eV/K|$ mentioned above is not necessarily available if conduction electrons or phonons, instead of magnons, also carry some of the heat flow through the magnonic polarizer 112 without contributing to the torque. Specifying a ferrite composition or other ferromagnetic insulator for the magnon source 112 eliminates this threat from conduction electrons. However, the effect of phonons remains significant. The Kapitsa interfacial conductance $G_{Kap}$ is the parameter relevant to this effect. Unfortunately, experimental data for $G_{Kap}$ across a metal/ferrite junction is not available.

Several of the estimates given here assume low and high values of $G_{Kap}$, shown in the first column of Table 1, taken from a range of measured $G_{Kap}$ values reported for eleven junction compositions, not involving magnetism, in an open publication [R. J. Stoner and H. J. Maris, Phys. Rev. B48, 16373 (1993-II)]. Using the input data shown in Table 1, quantum theory predicts the useful quantum torque yield $\epsilon_{us}$ divided by voltage V applied, for example, to a heater such as the tunnel barrier appearing in FIGS. 3 and 4. The third and fourth rows of Table 1 give predictions of $\epsilon_{us}/V$, corresponding to these two assumed values of $G_{Kap}$, calculated from theory for each of two electrically insulating spinel-ferrite film compositions: $NiFe_2O_4$ and $MnFe_2O_4$. Consider a typical nanoscopic spintronic device value of V=300 mV which is too small to degrade an MgO tunnel barrier such as the barriers 315 and 411 in FIGS. 3B and 4B. The predicted torque yields shown in Table 1 range between $\epsilon_{us} = 4.2$ and 10.5, which are between 8.4 and 21 times higher than the $\epsilon_{mtj} \leq 1/2$ known in current-driven STT using an MTJ.

A rigorous direct argument gives the sign of the in-plane component of magnonic spin-transfer torque $\tau$ acting on the free magnet. Consider the case that heat flows from the magnonic polarizer 112 toward the free magnet 114 as in FIG. 5A. Magnons, each bearing −1 spin component along the ferrite moment axis $S_{frt,\xi}$ carry heat through the polarizer and annihilate at the polarizer/spacer interface.

By the law of continuity for electron spin component, the σ-component of spin momentum transferred to the free magnet 114 by annihilating magnons must also be negative. It follows that the torque exerted on the free-magnet moment $S_{fm}$ in Case 1 (FIG. 5A) tends to align it oppositely to the ferrite moment (see FIGS. 1B and 1C). Reversing the direction of heat flow, as in Case 2 (see FIGS. 2B and 2C), reverses this direction. However, reversing the sign of applied voltage V in a Joule-effect heater does not change the torque direction.

The quantum derivation described above provides some key requirements for high useful yield of thermagnonic spin transfer in many aspects of the invention. One requirement is the provision of an interfacial magnetic monolayer 112M (see FIG. 5A) with sufficiently large exchange coupling K (>0) to the ferrite moment. A second requirement is a large exchange-coupling coefficient $J_{sd}$ of this monolayer 112M to the conduction electrons of the metal comprising the non-magnetic normal layer 113 together with the said monolayer 112M. This same-site interaction coefficient $J_{sd}$ may have either algebraic sign. A third requirement is to ensure that the interfacial heat flow between the spacer 113 and the phonon channel (and conduction-electron channel, if present) within the polarizer 112, as measured by $G_{Kap}$, is sufficiently weak.

Figure 5A:
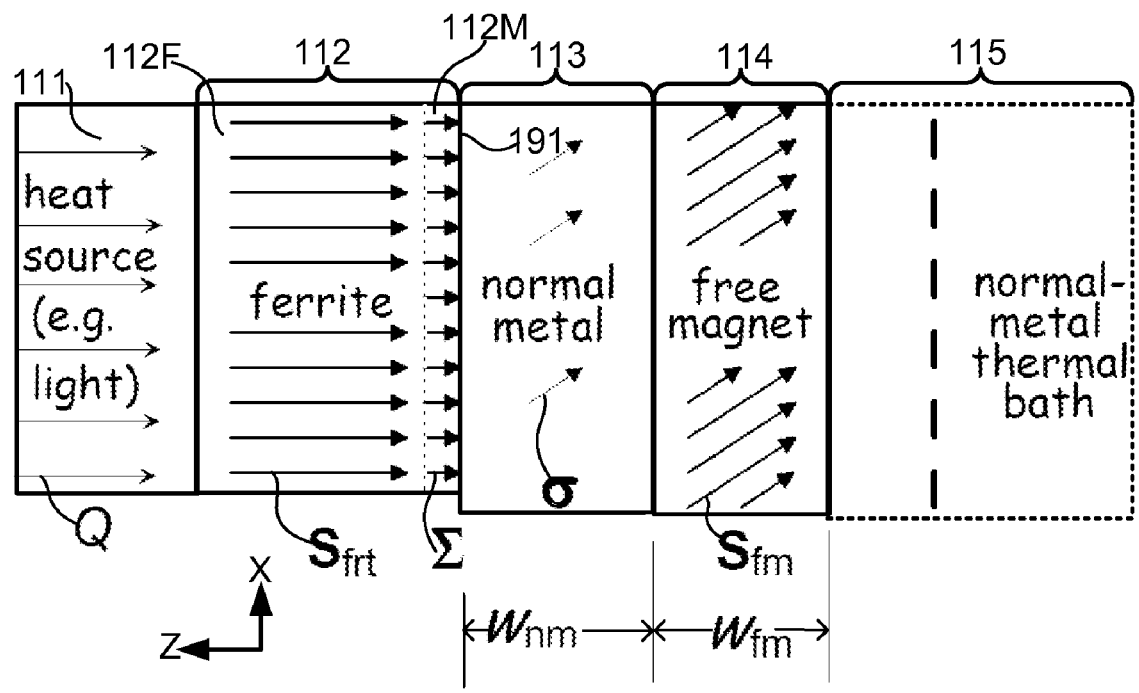
FIG. 5A illustrates directions of spin polarization in some illustrative structures in accordance with the invention.
Figure 5B:
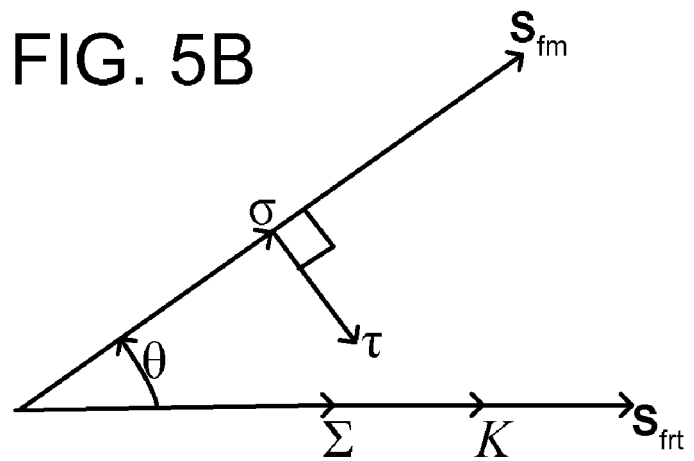
FIG. 5B illustrates a relationship between the directions of spin polarization of FIG. 5A.

In FIG. 5B, the angle θ is the angle between spin moment vector Sfm of the free magnet 114 and the spin moment vector Sfrt of the ferrite 112F. This angle θ is changed by heat transfer across interface 191 between electrically resistive magnet 112 and spacer 113 in FIG. 5A. This angle θ is either 0° or 180° in the absence of heat transfer across interface 191. Note that the heat transfer across interface 192 is not relevant to the discussion. In electrically resistive magnet 112 as a whole (i.e. in the combination of ferrite 112F and monolayer 112M) each magnon simultaneously carries an amount of heat energy and a unit of spin and so the flow of heat is unified with the flow of spin in resistive magnet 112.

When a magnon is annihilated at interface 191 (and simultaneously an electron in spacer 113 is reflected from interface 191), heat and spin from the annihilated magnon can flow in different directions in spacer 113, e.g. as illustrated in FIG. 9A. Therefore, the flow of spin current (same as spin momentum current) through the spacer 113 is not coupled to the flow of heat through the spacer 113. Therefore, the spin current (illustrated by an arrow labeled "SPIN" in FIG. 9A) originates from the interface 191 and flows freely through the spacer 113 via an imbalance of the spin pairing in the spacer 113. In several aspects of the invention, the monolayer 112M (also called interfacial layer) includes magnetic atoms (or ions) comprising locally bound electrons whose spin moments conduct heat efficiently (with high thermal conductances) to the interior spins of both the ferrite 112F and (in the opposite direction) to the spacer 113.

In FIGS. 5A and 5B, Σ is a spin moment vector of 3d electrons in monolayer 112M e.g. electrons bound to Mn nucleus, and σ is a spin moment vector of free electrons in spacer 113. σ arises from a combination of annihilation of magnons at interface 191 and reflection of electrons in spacer 113 by free magnet 114. Hence, σ has the direction of the spin moment vector Sfm of the free magnet 114 while having a rate of change in the direction of the spin moment vector Sfrt of the ferrite 112F. In FIG. 5B, torque τ that arises due to spin current is oriented at 90° relative to the spin moment vector Sfm of the free magnet 114.

In FIG. 5A Wnm is the thickness of spacer 113 e.g. at a minimum of 2 nm, which is the smallest dimension possible to prevent touching between 112 and 114 despite roughness therebetween due to fabrication. Note that the effect of spin transfer is diminished inversely relative to the extent Wnm by which exceeds a maximum of 30 nm which is the mean free path of an electron in spacer 113. In FIG. 5A, Wfm is the thickness of free magnet 114, e.g. 5 nm.

Easy axis of ferrite 112F is horizontal to the right in FIG. 5A, i.e. in the −Z direction. Easy axis is a unique axis along which energy of the spin moment vector, as a function of direction, is at a minimum. In several memory cells in accordance with the invention, easy axis of free magnet 114 is selected to be at a value $\theta_0$ that is non-zero relative to the easy axis of ferrite 112F. For example, $\theta_0$ may be predetermined for memory cells to be 20° or 45°, depending on the aspect of the invention. Such fixed alignment (also the initial alignment) between th two easy axes creates a non-zero initial torque and thus better ensures a switch of the free-magnet moment, on transfer of spin between the two magnets. In several oscillators in accordance with the invention, easy plane of free magnet 114 is selected to be orthogonal to the easy axis of ferrite 112F. Easy plane is a plane wherein the spin moment vector has the same energy in all directions (in the easy plane), and the energy in this plane is at a minimum relative to the spin moment vector's energy in all directions in 3D space.

In some aspects of the invention, two methods are used for fabricating an interfacial magnetic monolayer 112M satisfying these requirements:

A satisfactory interface may occur simply in the course of depositing the ferrite. The word satisfactory here means that the atoms of the interfacial magnetic element have the required $4s^x 3d^5$ (where x is near 1) electronic state capable of providing a strong same-site sd interaction. The strength $f_{sd}$=0.5 eV, assumed in the above calculations, is known for the dilute magnetic alloys Cu:Mn, Ag:Mn, and Au:Mn.

If the oxidation of the ferrite is sufficiently strong, it may happen that the magnetic atoms in such a naturally occurring interfacial monolayer 112M may not have the 4s electron requisite for such a strong sd-exchange. In this case, one must deposit approximately one atomic element of Mn or Fe without oxygen between the depositions of the ferrite and the noble-metal spacer element. For, in the fully metallic case, the presence of the 4s electrons and the resulting value $J_{sd}$=0.5 eV are well established.

For the sake of simplicity of calculation, the description outlined above treats explicitly a single magnetic interfacial monolayer 112M, as indicated in FIG. 5A. The discussion shows that the useful quantum yield increases with the exchange interaction between a 4s electron and a 3d electron bound to the same nucleus (e.g. Mn or Fe). The coefficient $J_{sd}$ in the description measures the strength of the sd interaction. Every atom of a ferromagnetic metal such as Fe, Co, Ni or alloy of these elements is subject to a strong sd interaction. It follows that deposition of more than one layer of metallic magnetic atoms between the ferrite 112F and non-magnetic spacer increases the number of sd interactions participating in the spin transfer and therefore prove to increase the useful torque yield to a value closer to the intrinsic quantum torque yield. Hence in some aspects of the invention, polarizer 112 includes multiple layers 112M of metallic magnetic atoms adjacent to interface 191 with spacer 113.

A fundamental characteristic of magnonic spin transfer in some aspects of the invention is that reversing the direction of the electric current that drives the heater 111 does not change the direction of the created torque. This characteristic does not pose a disadvantage for its use in an oscillator 300 (FIG. 3B) because this device needs only one direction, whether convergent or divergent as described above, of spin transfer torque in order to function. Therefore, the advantage of greater efficiency, discussed above, of MST is apparent. Its use in many aspects of the invention improves performance in some combination of 1) increase of oscillation frequency, 2) decrease of input power, and 3) increase of output. In view of the above discussion, in several aspects of the invention the thermagnonic quantum torque yield $\epsilon_{us}$ exceeds the corresponding quantity for a magnetic tunnel junction, and this condition implies a great spintronic advantage, particularly in application to MRAM (e.g. see 400 in FIG. 4B).

The spin-transfer torque available during a write operation in an MRAM normally limits writing speed, freedom from write error, and scaling to higher memory density. The electric-current output of one transistor serving each memory cell must provide this torque by some form of spin transfer. (The existing limit on electric current available from a transistor is often considered to be near 1 micro-Ampere per nanometer of lithographic-feature width.)

In many aspects of the invention, a spin transfer torque is proportional to the yield $\epsilon$ which means that thermagnonic spin transfer in various devices in accordance with the invention provides a marked advantage with respect to writing speed, freedom from write error, and scaling of memory density. In some aspects of the invention, the investigated ferrite compositions $NiFe_2O_4$ and $MnFe_2O_4$, discussed above, are preferred for application of MST to MRAM.

For use in magnetic random-access memory 400, 450 (see FIG. 4B), the fact that the direction of magnonic spin-transfer torque does not reverse with that of driving current is a real disadvantage. Reversing the polarizer-moment direction with an external field, as described above and illustrated in FIGS. 4A-4C (or as described in any prior art) overcomes this difficulty. Nevertheless, this work-around in the MST-MRAM device described above for some aspects of the invention requires enlarging the cell area in comparison with that of prior-art STT-MRAM.

Moreover, the reliance on a single sign of MST-switching current $I_2$ permitted by the said work-around by transistor-driven polarizer switching current $I_1$ presents the incidental benefit, cited in certain STT-MRAM prior art, of making possible cell selection using cell-dedicated diodes instead of transistors in certain aspects of the invention. Diodes are capable of greater current output than transistors for a given lithography scale, which fact also contributes to increased write speed and/or error suppression using MST in several aspects of the invention.

The total current required for different kinds of spin-transfer torque, including MST in many aspects of the invention, scales as a constant in memory cells (see FIG. 4B) that rely for thermal stability on uniaxial bulk magnetic anisotropy. It follows that the improved spin-transfer efficiency attainable with MST as described above permits scaling down for more scaling generations in accordance with the invention, than those achievable with the current-driven spin transfer of prior art.

In some aspects of the invention, structures 110, 120 (FIGS. 1A-1C, 2A-2C) are operated by performing one or more acts 601-603 illustrated in FIG. 6A. Depending on the aspect of the invention, an act 601 may be performed, to change a direction of magnetization of polarizing magnet 112 (FIGS. 1A, 2A), e.g. by passage of a current in a long strip located adjacent to the structure. Initially, the magnetization direction in resistive magnet 112 (to be used as a polarizing magnet) may point in a random direction, immediately after a structure 110, 120 is fabricated. Therefore, an optional act 601 may be performed in some aspects of the invention, to orient the magnetization moment of resistive magnet 112 in a predetermined direction, either at the factory (e.g. in case of an oscillator) or during normal operation (e.g. in case of a memory cell).

For example, FIG. 6B illustrates a structure in memory cell 410 (described above in reference to FIG. 4B) wherein a spin moment vector 610 is shown to be oriented along an easy axis of magnetic anisotropy energy in the resistive magnet 417 which happens to be in the positive X direction in FIG. 6B.

The magnetic moment vector (which is not shown in FIG. 6B) is oriented in the negative X direction in FIG. 6B.

Initially, the spin moment vector of the free magnet 114 (FIGS. 1A, 2A) may point in any random direction, although eventually it comes to rest in the direction of the easy axis of anisotropy energy therein, which is illustrated by arrow 613 in the negative X-direction in FIG. 6B. At this stage, orientation of the spin moment vector 613 in the negative X-direction may be sensed (see branch 604 from act 601 to act 603 in FIG. 6A) by a sensor in memory cell 410 which is read as a data bit of value 0. The two equilibrium directions (in the negative X direction and the positive X direction) of the free-magnet moment 613 represent the digital 0 and 1 states of the memory element (also called memory cell).

In an act 602 (FIG. 6A), heat is transferred between spacer 113 and polarizing magnet 112 (FIGS. 1A, 2A) by generating heat in a heater (e.g. by passing a current through the heating element). For example, an arrow 612 in FIG. 6C shows the flow of heat from the diamagnetic material in short strip 416 to the resistive magnet 417, across interface 191 (described above). During the heat transfer, many of the heated electrons (carrying left direction spin of spin moment vector 613 in FIG. 6B) travel downward through spacer 416 to interface 191 as shown by arrow 614 in FIG. 6C. Each left spin electron denoted by arrow 614 carries one-half of a fundamental spin unit with direction along the negative x-axis. During collision and subsequent upward scattering of this electron from the interface 191, this spin becomes reversed, forming now an upward moving right-spin electron moving in the upward direction through spacer 416, as shown by arrow 615 (FIG. 6C). The change of one whole negative-x spin unit possessed by the scattered electron is conserved by the simultaneous creation of one magnon carrying one whole unit of negative-x spin.

Note that the flow of electrons denoted by arrows 614 and 615 are equal in magnitude although opposite in spin direction, and hence there is no net flow of electric charge through spacer 416. Instead, a current of electron spin (i.e. spin current) is formed between magnets 417 and 415 via spacer 416, as a net result of the x-component of the right spin flowing upwards as per arrow 615 and the x-component of the left spin flowing downwards as per arrow 614, and the two spin flows 614, 615 when added algebraically, form the spin current through spacer 416.

Figure 6D:
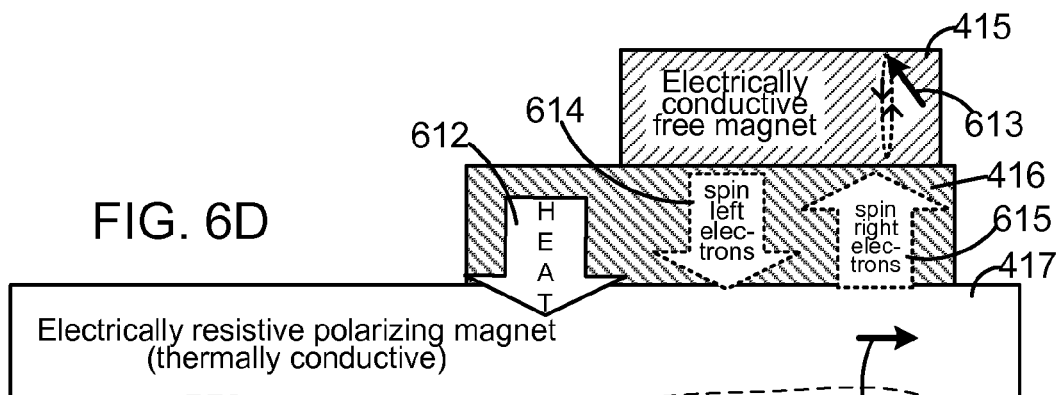
Figure 6E:
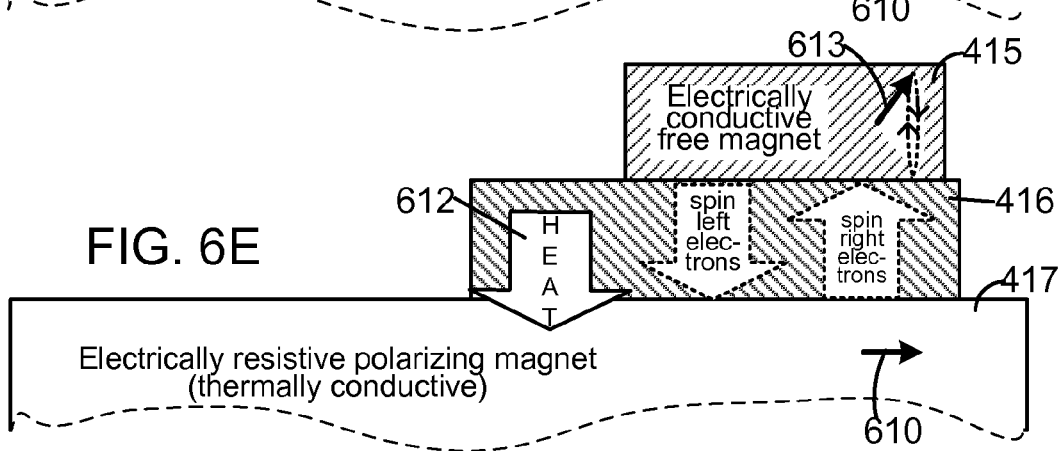

In spacer 416, the spin current (which is the flow of x component of spin) transfers the right spin from spin moment vector 610 in resistive magnet 417 to free magnet 415 thereby make the spin moment vector therein precess around the negative X-axis, represented by arrow 613 in FIG. 6C. In all that follows, the precession of vector 613 shown in FIG. 6C will for the sake of brevity be described as resembling the spinning of a top. Those skilled in the art will understand that the motion of vector 613 can be more complicated, without invalidating the inferences made in this discussion. The rate of precession of vector 613 is several orders of magnitude lower than the rate of an individual electron repeatedly reflecting between interfaces considered in the spin flows 614, 615. While heat is applied, a cone angle formed by precession of vector 613 increases, i.e. vector 613 tilts farther away from the negative X-direction, as shown in FIG. 6D. Eventually, as heat is applied continuously, vector 613 goes from precessing around the negative X-axis, through 90° relative to the X-axis, and then to precessing around the positive X-axis as shown in FIG. 6E. After vector 613 has switched to precessing around the positive X-axis, act 602 (FIG. 6A) is completed.

Figure 6F:
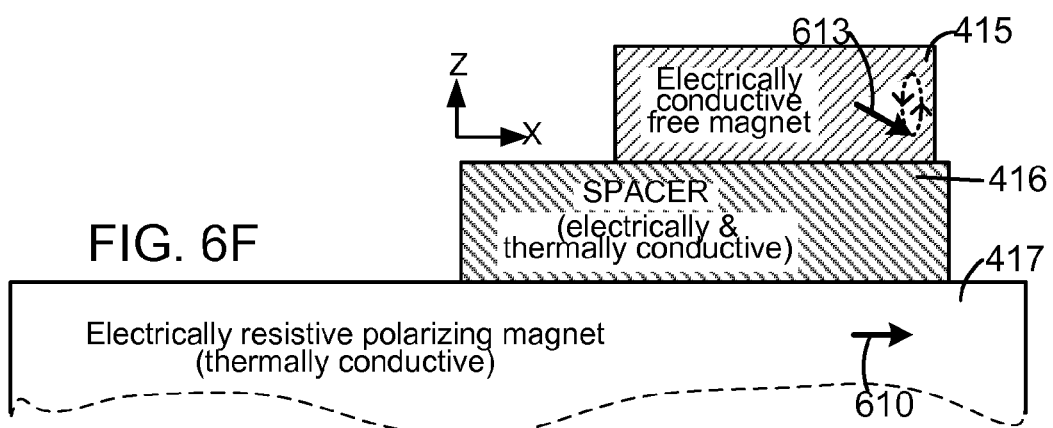
Figure 6G:
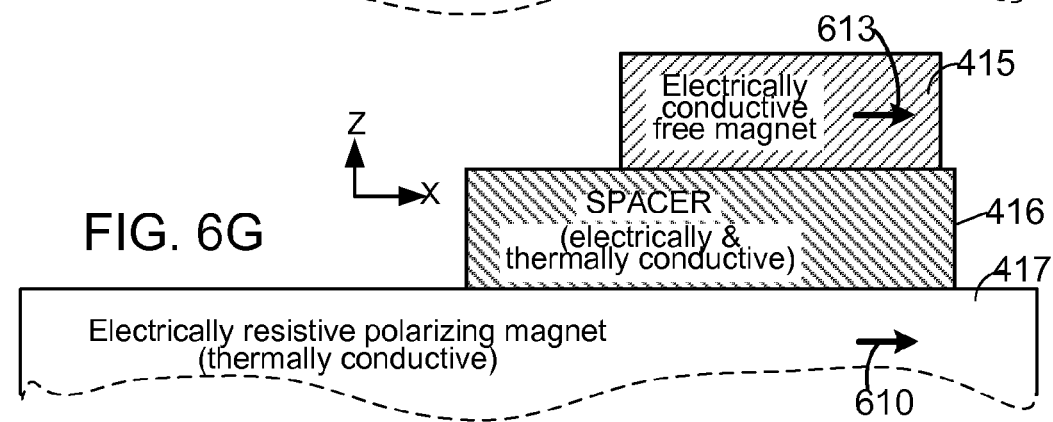

On completion of act 602, heat is no longer applied and the spin current in spacer 416 disappears, as shown in FIG. 6F. On passage of time, the cone angle of precession of the spin moment in free magnet 415 reduces (in the absence of heat transfer), and eventually vector 613 is aligned again along the easy axis in magnet 415 but this time in the positive X direction as shown in FIG. 6G. At this stage, orientation of the spin moment vector 613 in the positive X-direction can be read (whenever necessary) by the sensor in memory cell 410 (shown in FIG. 4B) as a data bit of value 1. Note that as the spin moment vector 613 is aligned with the easy axis in magnet 415, this data bit of value 1 remains unchanged even when power to memory cell 410 is turned off, thereby to implement a static RAM (SRAM) in some aspects of the invention. When power is turned back on to memory cell 410, this data bit of value 1 may be read, whenever and as often as desired.

At this stage, as shown in FIG. 6G, spin moment vectors 610 and 613 in the polarizing magnet 417 and the free magnet 415 respectively are parallel to one another, both pointing in the positive X direction, to the right in FIG. 6G. In devices of the type illustrated in FIG. 4A-4C, at such a stage (when vectors 610 and 613 are parallel to one another) heat flow in the downward direction (in FIG. 6G) cannot change the orientation of vectors 610 and 613 relative to one another. Hence, in several aspects in accordance with the invention, the direction of the spin moment vector 610 is reversed (to make vector 610 point in the negative X direction) by applying a magnetic field as discussed below. After such a reversal of spin moment vector 610, downward heat flow stores a data bit of value 1 in memory cell 410, as follows.

Figure 6H:
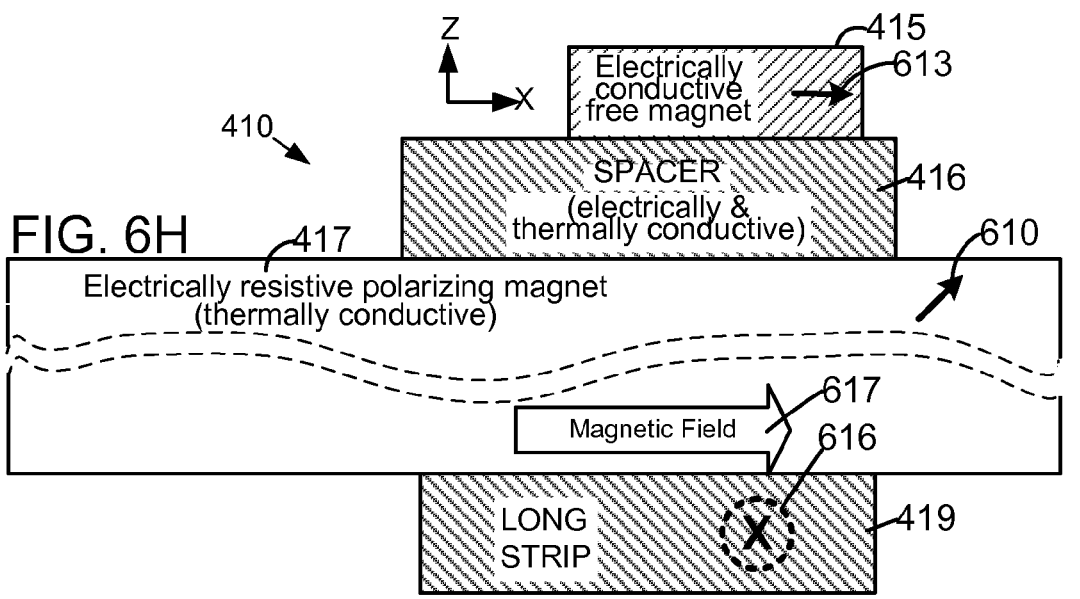
Figure 6I:
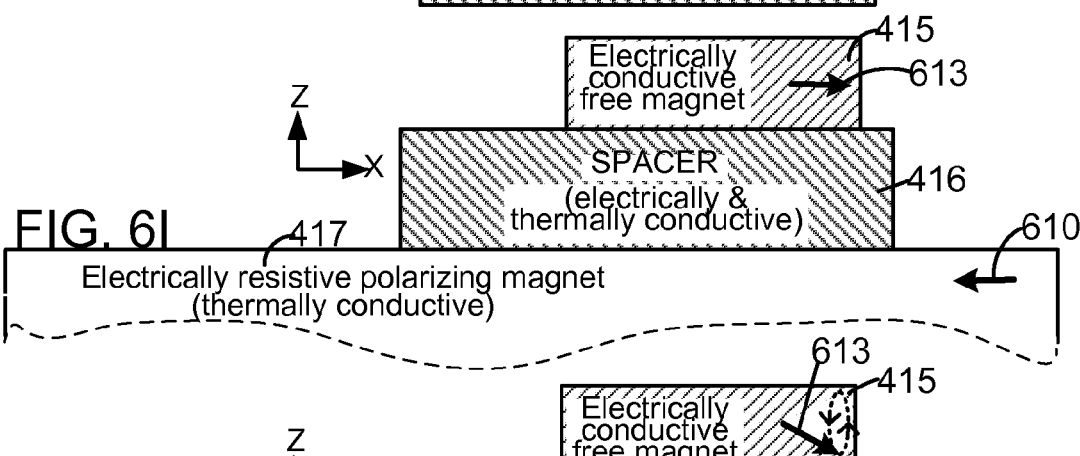

Specifically, as illustrated in FIG. 6H, in act 601 an electric current (formed of electrons) 616 is passed in the positive Y direction (into the plane of the paper in FIG. 6H) in the normal manner, through a long strip 419 that is conductive. Optionally, simultaneous electric currents may be passed symmetrically through one or more pairs of additional long strip lines identical and parallel to 419, all of which lie underneath nearby rows of memory cells shown in FIG. 4C (or 1109 above as in FIG. 11B). This stratagem may switch a greater area of 417 but be accomplished with a lower current density, thus decreasing the damaging effect of electromigration. Passage of current 616 generates a magnetic field shown by arrow 617 that changes the orientation of the spin moment vector 610 in the resistive magnet 417, as shown in FIG. 6H. After the spin moment vector 610 in resistive magnet 417 switches over, the current 616 is turned off as illustrated in FIG. 6I, and vector 610 eventually becomes oriented along the easy axis in resistive magnet 417, now pointing in the negative X direction.

Figure 6J:
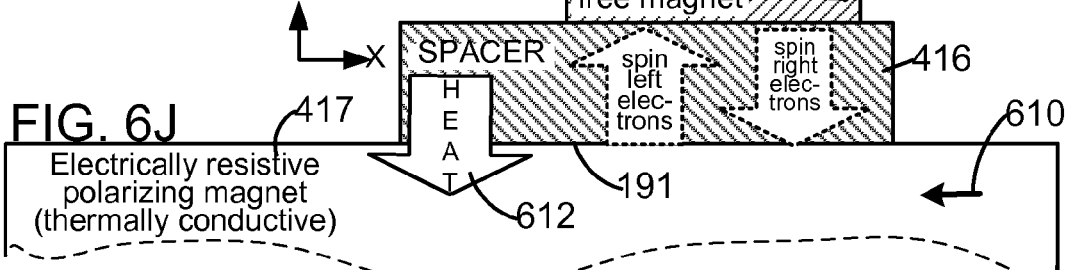
Figure 6K:
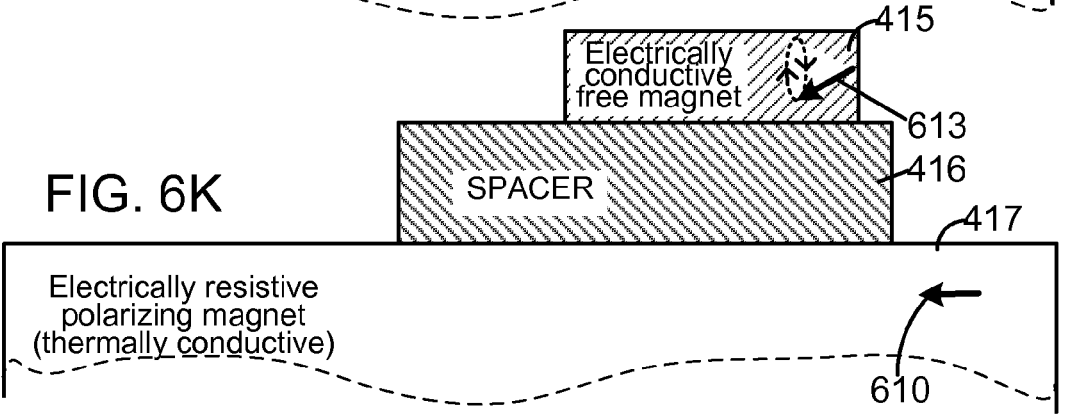

Thereafter, in act 602 (see FIG. 6A) heat is again applied as shown by arrow 612 in FIG. 6J. On transfer of heat through interface 191 at this stage, the spin moment vector 613 in the free magnet 415 starts precessing around the positive X axis, in the above-described manner. Any time after the spin moment vector 613 in free magnet 415 begins precessing around the negative X axis (as shown in FIG. 6K), the heat 612 is turned off and eventually vector 613 comes to rest in the negative X axis. This orientation of the spin moment vector 613, in the negative X-direction can be sensed (see act 603 in FIG. 6A) in memory cell 410 as a data bit of value 0, e.g. by measuring voltage for a preset current in the normal manner.

As per the above description of FIGS. 6B-6K, acts 601-603 are performed intermittently in some aspects of the invention. However, as will be readily apparent to the skilled artisan in view of this disclosure, in many aspects of the invention, either or both of acts 602 and 603 are performed continuously for an oscillator 300 illustrated in FIGS. 3A-3C. Specifically, act 603 is performed continuously in an oscillator 300 so as to sense the time-dependent x-component of the spin moment vector in the free magnet 314 (FIG. 3B). Act 602 may also be performed continuously, e.g. in an oscillator wherein the spin moment vector is made divergent from the easy axis by the applied heat, which is therefore applied continuously to keep the spin moment vector in precession. When operating such an oscillator 300, act 601 is not performed in some aspects of the invention.

Figure 7A:
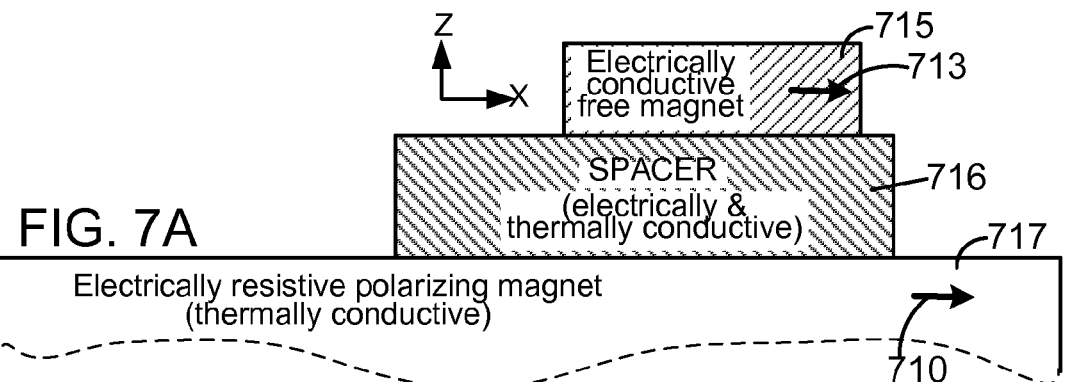
FIGS. 7A and 7B illustrate, in cross-sectional views, application of heat to change the direction of spin moment vector 713, in accordance with the invention.
Figure 7B:
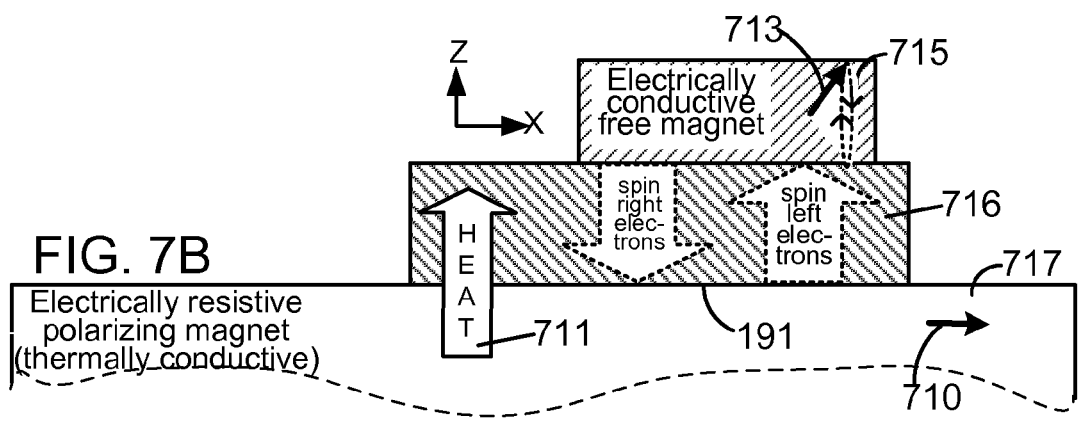
Figure 7C:
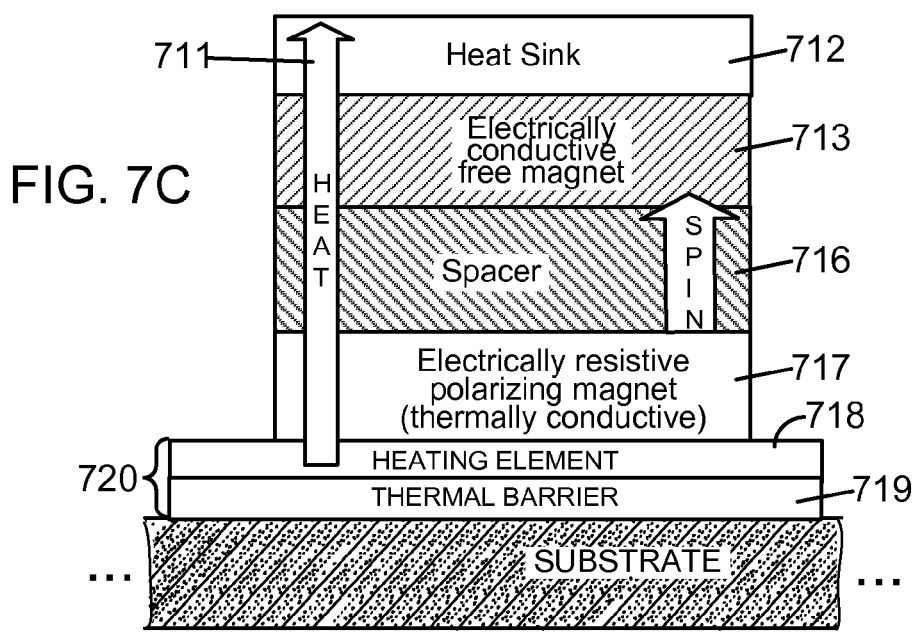
FIG. 7C illustrates, in a cross-sectional view, location of a heating element 718 at the bottom of a stack in accordance with the invention.

In some aspects of the invention, spin moment vectors 710 and 713 in the polarizing magnet 717 and the free magnet 713 respectively are initially parallel to one another as illustrated in FIG. 7A, and when heat flows upwards as illustrated by arrow 711, the spin moment vector 713 starts precessing, due to a spin current through spacer 716 that arises from annihilation of magnons at interface 191 in a manner similar to that described above. Upward heat flow 711 into a heat sink 712 originates in a heater 720 which includes a heating element 718 (such as a Joule-effect heater including an ohmic resistor to generate heat), and a thermal barrier 719 which is supported on a substrate (which may be formed of, for example, silicon, or metal, or glass).

Figure 8B:
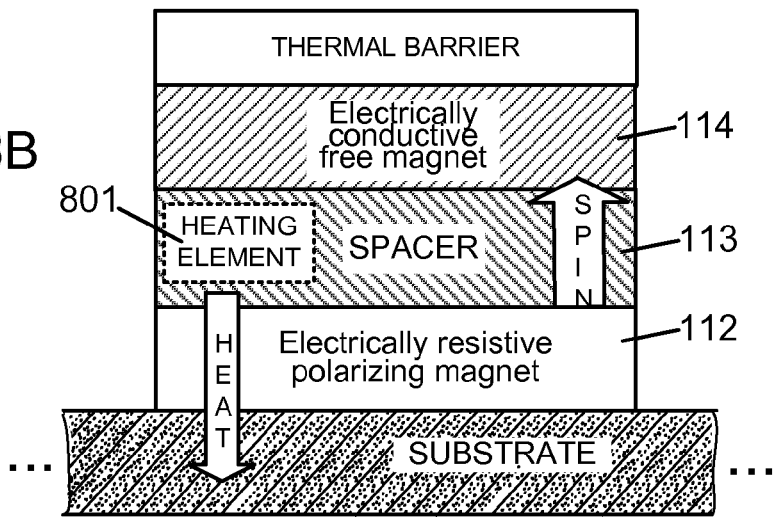
Figure 8C:
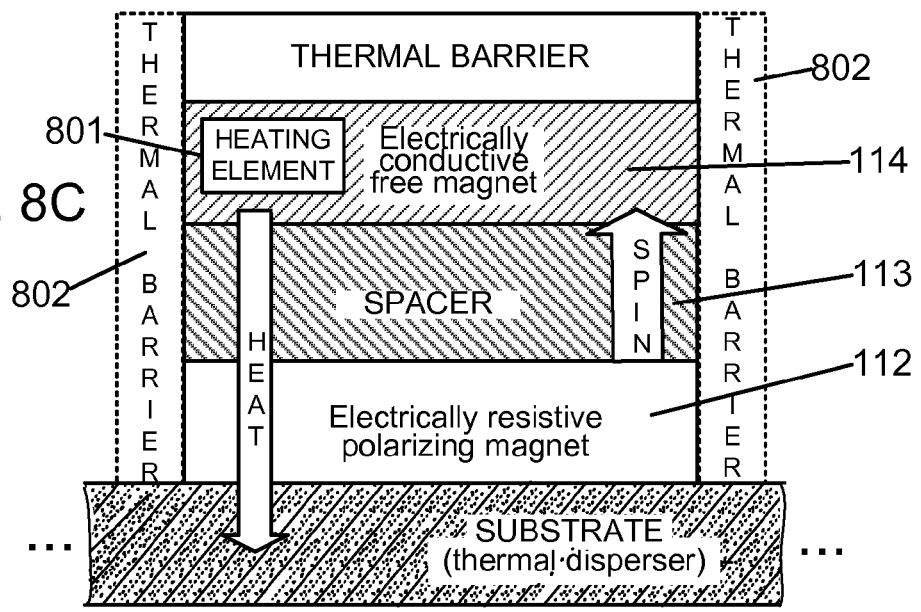

Although a heating element is different from other elements of a structure in several devices in accordance with the invention, in several aspects of the invention, a heating element 801 is included in or is formed by an electrically resistive polarizing magnet 112 (FIG. 8A), or by a spacer 113 (FIG. 8B) or by an electrically conductive free magnet 114 (FIG. 8C). Also, devices in accordance with the invention, may optionally include additional thermal barriers, such as a cylindrical thermal barrier 802 (FIG. 8C) that surrounds the above-described elements 112, 113 and 114. Note that in some aspects of the invention, thermal barrier 802 is formed by air or vacuum.

Air or vacuum separates an electrically resistive polarizing magnet 112 (FIG. 9A) from an electrically conductive free magnet 114 which therefore do not contact one another in accordance with the invention. Instead, in devices of the type illustrated in FIG. 9A both magnets 114 and 112 are in direct contact with a spacer 113. Hence, the term "direct contact" is used herein to mean there is nothing in between.

In many such devices, electrically resistive polarizing magnet 112 is in direct thermal contact with spacer 113 so that heat transfers freely across an interface 191 therebetween (FIG. 9A). Also in several such devices, electrically conductive free magnet 114 is in direct electrical contact with spacer 113 so that electrical charge transfers freely across an interface 192 therebetween (FIG. 9A). Although interfaces 191 and 192 are on the same side of spacer 113 (upper-most side in FIG. 9A), in other aspects of the invention interfaces 191 and 192 are on opposite sides of spacer 113 as illustrated in FIGS. 1B and 2B.

In several aspects of the invention, electrically resistive polarizing magnet 112 includes multiple layers, such as layer 901 layer 902 as well as a ferrite 903 as illustrated in FIG. 9B and interface 191 is at a surface of monolayer 901 in direct contact with spacer 113. As noted above, in some implementations layers 901 and 902 are only one atom in thickness (in the vertical direction in FIG. 9B), and therefore layers 901 and 902 are also referred to herein as atomic monolayers. Furthermore, in some aspects of the invention, heater 111 includes a light-emitting diode 111L which is spaced apart from magnonic polarizer 112 by a distance $S_{LED}$ as illustrated in FIG. 9C. Depending on the aspect of the invention, the value of $S_{LED}$ may be a few nanometers, e.g. 2 nm or the distance can even be 0 nm (i.e. in direct contact with polarizer 112).

As noted above, electron spin is transferred between an electrically conductive material of a free magnet and an electrically resistive material of a pinned magnet, via a spacer (such as a metal) that has free electrons (i.e. unbound electrons or valence electrons not permanently associated with any atom) to perform the spin transfer, in accordance with the invention. In several aspects of the invention, a spacer 113 is formed by a single material as illustrated in FIG. 9A, while in other aspects of the invention spacer 113 includes multiple materials. The multiple materials of a spacer 113 in accordance with this invention can take several forms, depending on the aspect.

For example, spacer 113 in some aspects of the invention is formed by two materials 113A and 113B that are respectively in contact with polarizing magnet 112 and free magnet 114 as illustrated in FIG. 9D. In this example, metallic bonds are formed at an interface 193 between materials 113A and 113B. The metallic bonds ensure presence of free electrons at interface 193 so that a spin current can flow easily therethrough. As another example, spacer 113 in some embodiments of the invention is formed by a material 113C and a number of impurities 113D . . . 113G embedded in material 113C as illustrated in FIG. 9E. In certain aspects of the invention, material 113C is diamagnetic while impurities 113D . . . 113G are paramagnetic and in some such aspects the combination 113 is either mildly diamagnetic or mildly paramagnetic although any magnetism in spacer 113 is sufficiently small to allow a free flow of electrons to transfer spin therethrough, between magnets 112 and 114.

Figure 10A:
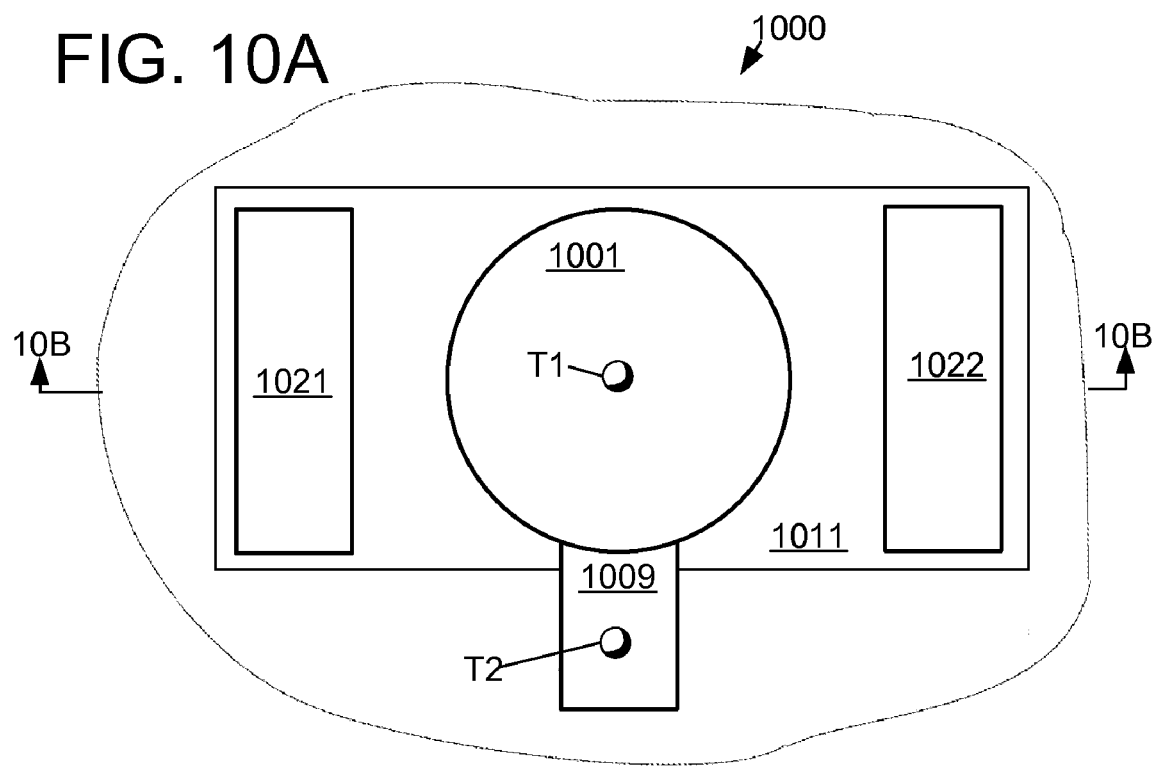
FIGS. 10A and 10B illustrate, in a plan view and a cross-sectional front view respectively, an oscillator in some aspects of the invention, in the respective directions 10A-10A (in FIG. 10B) and 10B-10B (in FIG. 10A).
Figure 10B:
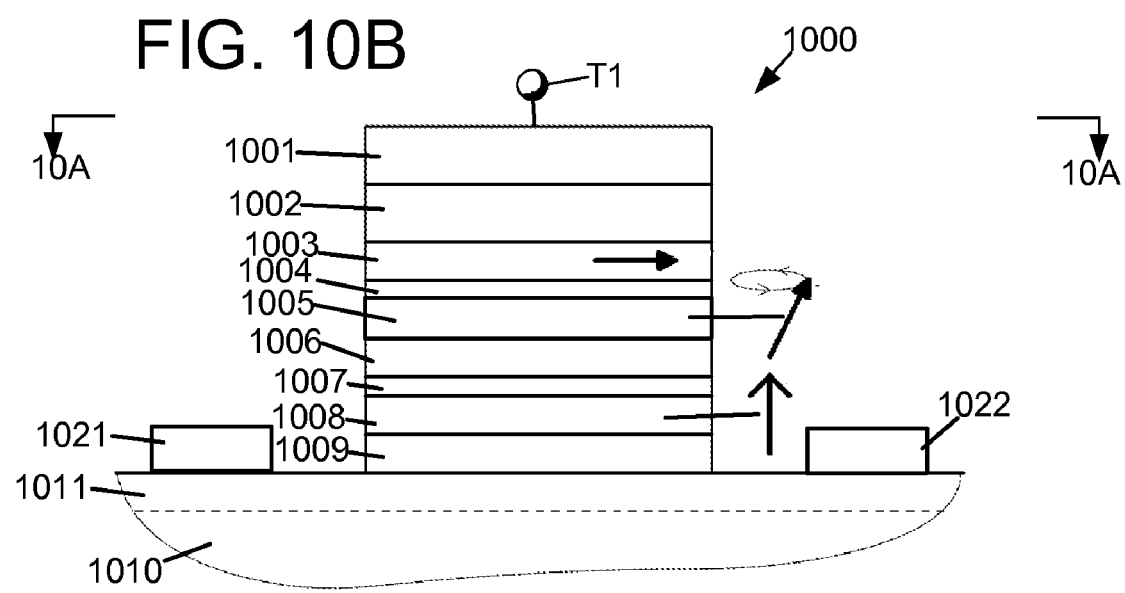

In some aspects of the invention, although an oscillator 300 (FIG. 3B) includes stack 120 (FIG. 2A) in several aspects of the invention another oscillator 1000 (FIGS. 10A, 10B) includes stack 110 (FIG. 1A). As illustrated in FIG. 10B, oscillator 1000 includes a silicon substrate 1010 with a diffuse silicon resistor 1011 formed therein. Formed thereon are electrodes 1021, 1009 and 1022. Formed on electrode 1009 are the following in sequence: electrically resistive magnet 1008, atomic monolayer 1007, diamagnetic spacer 1006, free magnet 1005, tunnel barrier 1004, electrically resistive magnet 1003, antiferromagnet 1002, electrode 1001.

Figure 11A:
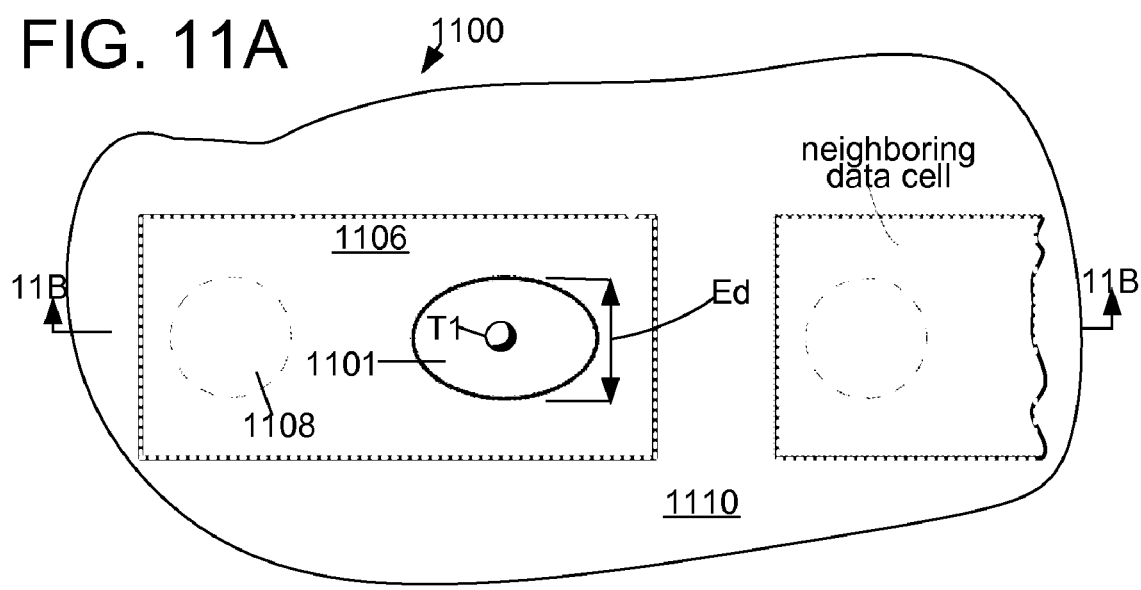
FIGS. 11A and 11B illustrate, in a plan view and a cross-sectional front view respectively, a memory cell in some aspects of the invention, in the respective directions 11A-11A (in FIG. 11B) and 11B-11B (in FIG. 11A).
Figure 11B:
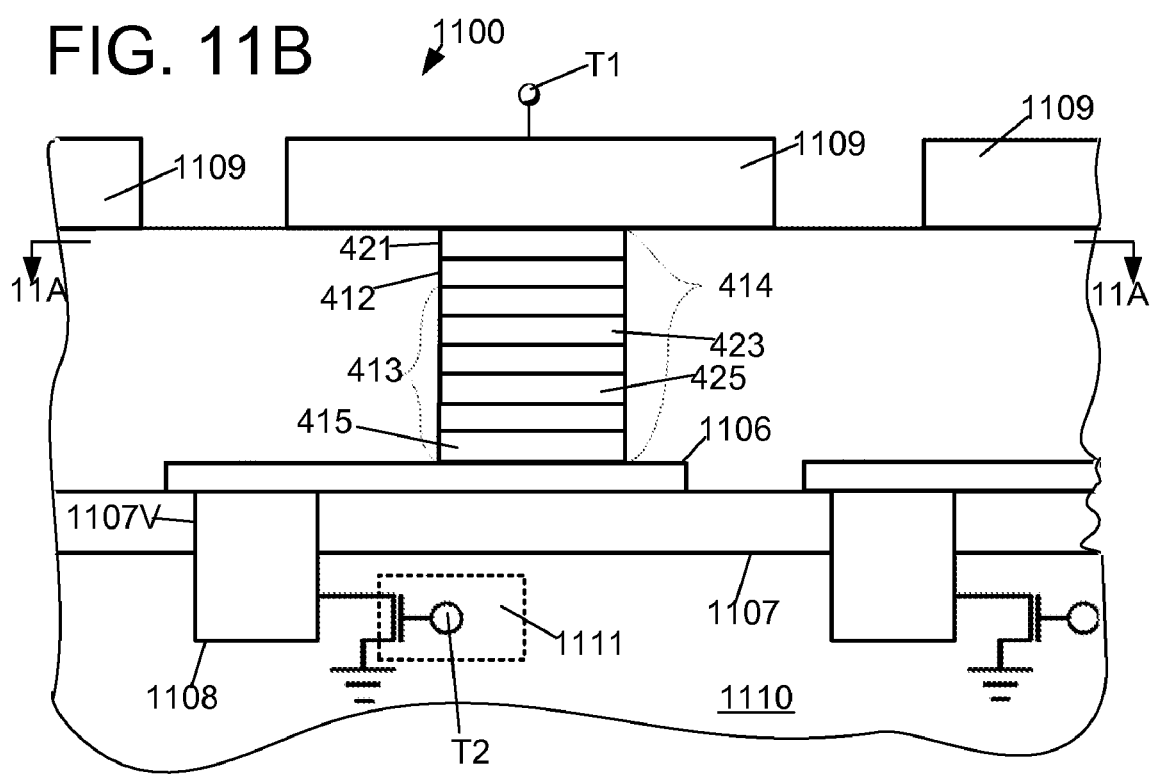

In some aspects of the invention, although a memory cell 410 (FIG. 4B) includes a long strip 419 at the bottom (below resistive magnet 417), in several aspects of the invention a strip 1109 is located at the top (above electrode 1101) as illustrated in FIG. 11B. As illustrated in FIG. 11B, memory cell 1100 includes a silicon substrate 1110 with a transistor 1111 formed therein. Coupled to transistor 1111 is an electrode 1108 that is located in a via hole through resistive magnet 1107, and is coupled to a short electrode 1106 that lies on top of resistive magnet 1107. Formed thereon are the following in sequence: magnetic tunnel sensor 1103 (which includes a free magnet, tunnel barrier, pinned magnet #2, normal metal, pinned magnet #1, antiferromagnet) and formed thereon a thermal barrier 1102, and formed thereon electrode 1101. Elements 1101, 1102 and 1103 together constitute an elliptical pillar on which is located the long strip 1109.

In certain aspects of the invention, an integrated circuit containing a memory cell 1100 (see FIGS. 11A-11B) that uses Version #2 stack 120 (see FIGS. 2A-2C) is fabricated as described below, in one or more of steps (A1)-(A9) either alone or in some combination with one another:

(A1). Begin with a conventional silicon wafer substrate such as common for CMOS integrated circuits, comprising digital circuitry for powering and sensing data in a rectangular memory array comprising rows and columns of cells to hold data bits (of binary value 0 or 1). Such circuitry in many aspects of the invention includes a DC current supply circuit to provide 100 microamperes, and a voltage sensor for sensing the direction of magnetization (and hence the data stored in a cell).

(A2). Sputter or CVD 20 nm thick ferrite on much of the wafer, having composition preferably at least one of: manganese ferrite $MnFe_2O_4$, mixed lithium-iron ferrite $Li_{0.5}Fe_{2.5}O_4$, yttrium-iron garnet $Y_3Fe_5O_{12}$.

(A3). Form studs for connecting each eventual short electrode 1106 through the ferrite to an individual, previously formed, transistor for each cell.

(A4). Sputter metal for short electrodes over the wafer and deposit the pillar materials shown in the front view of FIG. 11B in accordance with U.S. Pat. No. 7,411,817 granted to Nozieres et al. These comprise, in sequence, in pillar 414 (see FIG. 11B) free magnet 415 (at the bottom of pillar 414) having thickness 3 nm, tunnel barrier (not labeled in FIG. 11B), pinned magnet 425, normal metal (e.g. formed of Ruthenium to avoid magnetic interaction between two pinned magnets), pinned magnet 423, antiferromagnet (not labeled in FIG. 11B), thermal barrier 412, and electrode 421.

(A5). Use a subtractive lithography method to define the pillar cylinder down to the level of the free-magnet/short-electrode interface. The rectangular or elliptic pillar cross section has aspect ratio near 2:1. In several aspects of the invention, the dimension Ed (see FIG. 11A) is 45 nm, based on integrated circuit (IC) technology using 45 nm linewidth lithography. In some aspects of the invention, Sw is 2 times Ed (i.e. 2*Ed, or 2×Ed, wherein "*" and "×" both denote multiplication).

(A6). Use subtractive lithography again to define the lateral shapes of the short electrodes whose dimensions are the minimum permitted by the line width of the lithography technology. In some aspects of the invention, Sw is 2 times Ed and the structure of the memory along the vertical in FIG. 4A is 4×Ed. The horizontal length of the short Strip electrode 416 is 6×Ed and the horizontal period is 8×Ed.

(A7). Fill the spaces between said pillars and up to a predetermined level above the pillars with $SiO_2$. Planarize said $SiO_2$ until the pillar electrodes are exposed.

(A8). Print or otherwise deposit the long electrodes (also called "long strips") to connect with pillar electrodes 421 (FIG. 11B), each extending over one complete column of memory cells (in the vertical direction in FIG. 11A). In some aspects of the invention, strip 1109 (FIG. 11B) has a width of 3*Sw, wherein Sw is described above. In such aspects of the invention, a column of memory cells has a period (center-to-center distance of two memory cells) of 4*Ed. Therefore, the length of strip 1109 exceeds 4*Ed*N, wherein N is the number of cells in a column of an array, e.g. N=128 cells.

(A9). Raise the temperature sufficiently to temporarily eliminate exchange coupling pinning the upper metallic magnet 423 (FIG. 11B) and apply a magnetic field of 200 Oe horizontally parallel to the major diameter of the pillar 414. Then turn off the field after allowing the work to cool. This operation permanently pins the upper metallic magnet 423 in a horizontal direction and magnet 425 in the opposite direction.

In some aspects of the invention, an integrated circuit containing an oscillator that uses Version #2 stack 120 (see FIGS. 3A-3C) is fabricated as described below, in one or more of steps (B1)-(B8) either alone or in some combination thereof:

(B1). Begin with a conventional silicon wafer substrate such as common for CMOS integrated circuits, comprising digital circuitry for powering and detecting oscillation, formed using 45 nm linewidth. Depending on the aspect of the invention, such circuitry includes a DC current supply of 100 to 300 microamperes and voltage sensor for the 5-30 GHz output generated across to-be-fabricated terminals T1 and T2.

(B2) Deposit the material for the pinned resistive magnet in two steps, along the lines of N. N. Shams et al, J. Appl. Phys. 97, 10K305 (2005). Use a region of the substrate beside that supporting the digital circuitry. First, sputter 20 nm of Pt. Second, sputter 30 nm of barium ferrite ($BaFe_{12}O_{19}$) with the substrate temperature held at 475° C. to result in the crystallographic hexagonal axis oriented perpendicular to the plane of the substrate.

(B3) Sputter the base electrode material composed of copper. Deposit the pillar materials shown in the front view of FIG. 3B in accordance with the thicknesses and compositions of MRAM fabrication by U.S. Pat. No. 7,411,817 (see above) These include, in sequence free magnet, tunnel barrier, metallic magnet, antiferromagnet, thermal barrier, and electrode.

(B4) Use a subtractive lithography method to define the pillar cylinder down to the level of the free-magnet/base-electrode interface. In some aspects of the invention, the pillar diameter is between Dp=200 nm and Dp=500 nm, depending on the desired output power of the oscillator 300 (FIG. 3B).

(B5) Again use subtractive lithography to define the lateral dimensions of the base electrode together with the pinned magnet. The dimensions of the base electrode and pinned magnet are 1.5Dp×2Dp (wherein Dp is the pillar diameter as noted above).

(B6) Solder the leads from the control circuitry to the terminals T1 and T2.

(B7) Apply an external magnetic field exceeding 3 kOe vertically upwards, and then remove it, in order to leave the resistive magnet in a upward magnetized remanent state.

(B8) Raise the temperature sufficiently to temporarily eliminate the exchange field acting on the upper metallic magnet, and apply a magnetic field of 200 Oe horizontally. Then turn off the field after allowing the work to cool. This operation pins the upper metallic magnet in a horizontal direction.

In some aspects of the invention, an integrated circuit containing an oscillator that uses Version #1 stack 110 (see FIGS. 10A-10B) is fabricated as described below, in one or more of steps (C1)-(C12) either alone or in some combination thereof:

(C1). Begin with a conventional silicon wafer substrate of the type commonly used in normal CMOS integrated circuits, comprising integrated circuitry for powering and detecting oscillation. Depending on the aspect of the invention, such circuitry includes one primary DC current supply of 0.1 to 1 milliamperes for input power to the heater and a secondary supply of 1 to 10 Volt DC for receiving the 5-30 GHz generated output.

(C2). Form base diffusion and ion implant sufficiently to create an ion-implanted resistor material 1011 (FIG. 10B) on the surface of the substrate 1010, having 5 kOhm per square resistance. Perform this operation in a region of the substrate 1010 aside from that containing the said integrated circuitry.

(C3). To deposit the Pt material for forming electrodes 1009, 1021 and 1022 and a hexaferrite precursor for the resistive magnet, sputter 20 nm of Pt.

(C4). Deposit the pinned resistive magnet material 1008 by the method described by N. N. Shams et al, in J. Appl. Phys. 97, 10K305 (2005) entitled "Magnetic properties of BaM/Pd—Pt double-layered thin film deposited at various substrate temperatures" and which is incorporated by reference herein in its entirety. Sputter 30 nm of barium ferrite ($BaFe_{12}O_{19}$) 1008 with the substrate temperature held at 475

C to result in the crystallographic hexagonal axis oriented perpendicular to the plane of the substrate. Enhance the MST effect by depositing an atomic monolayer 1007 of Mn on said ferrite in the presence of oxygen.

(C5). Sputter the remaining pillar materials, above said spacer 1006, visible in the front view shown in FIG. 10B in accordance with the thicknesses and compositions of a conventional field sensor comprising a magnetic tunneling junction. These materials include, in sequence, a free magnet 1005, a tunnel barrier 1004, a metallic magnet 1003, an antiferromagnet 1002, and the pillar electrode 1001 (FIG. 10B).

(C6). Use a subtractive lithography method to define the pillar cylinder down to the level of the pinned-magnet/Pt-precursor interface. The pillar diameter will be between Dp=200 and Dp=500 nm in thickness, depending on desired output power.

(C7). Again use subtractive lithography with a different mask to define the lateral dimensions of the three platinum electrodes 1021, 1022 and 1009. Electrodes 1021 and 1022 have exemplary dimensions of 200 nm×100 nm. Electrode 1009 has exemplary dimensions of 150 nm×100 nm.

(C8). Connect the leads from the said primary supply to Pt electrodes 1021, 1022.

(C9). Connect the leads from the said secondary supply to the pillar electrode 1001 and Pt electrode 1009.

(C10). Apply an external magnetic field exceeding 3 kOe vertically upwards, and then remove it, in order to leave the resistive magnet in a upward magnetized remanent state.

(C11). Raise the temperature sufficiently to temporarily eliminate the exchange field and apply a magnetic field of 200 Oe horizontally. Then turn off the field after allowing the work to cool. This action pins the uppermost metallic magnet 1003 in a horizontal direction.

Some aspects of the invention described briefly above are further described in detail in the following article, which is incorporated by reference herein in its entirety: "Initiation of spin-transfer torque by thermal transport from magnons" by John C. Slonczewski, published on Aug. 3, 2010, PHYSICAL REVIEW B 82, 054403 (2010).

In numerous devices in accordance with the here-invented thermagnonic STT, a material that is used to form a polarizing magnet is selected for having a bulk electrical resistivity greater than $\rho=1\times10^{-3}$ $\Omega$·cm, implying an areal electric conductance less than the order of $1\times10^{13}\Omega^{-1}$ m$^{-2}$ for a 10 nm-thick polarizer. According to the Wiedemann-Franz law, this value in turn implies a free-electronic areal thermal conductance amounting to the order of $1\times10^{2}$ MW/m$^{2}$K which is comparable to typical values of interfacial Kapitza conductance transported by phonons. Thus this electrical resistivity greater than $\rho=1\times10^{-3}$ $\Omega$·cm guarantees that the heat flow wasted by electron movements is smaller than the unavoided waste arising from phonons and approximately accounted for elsewhere in this analysis.

Moreover, this bound on areal resistance RA>$1\times10^{13}$ $\Omega m^{2}$ exceeds by two orders of magnitude the resistance typical for the interface between a ferromagnetic metal and a dielectric metal suitable for all-metallic thermoelectric STT. Consequently, the thermoelectric torque estimate of Hatami et al for thermally driven STT in an all-metallic trilayer structure would be correspondingly diminished and thus appears to be insufficient to switch the data state of a memory element. See Hatami et al. article entitled "Thermal Spin-Transfer Torque in Magnetoelectronic Devices" PHYSICAL REVIEW LETTERS 99, 066603 (2007) which is incorporated by reference herein in its entirety.

To summarize, if this >$1\times10^{-3}$ $\Omega$·cm bound on resistivity is satisfied, a majority of the spin transfer through the polarizing magnet is done by magnons rather than electrons and its strength is estimated properly as discussed above, for various devices in accordance with this invention. Examination of published data on resistivities of ferrimagnetic oxides reveals that nearly all compositions satisfy this bound, and hence are contemplated by the inventor for use in various devices in accordance with this invention. A borderline exception is $Fe_3O_4$, whose resistivity is about $1\times10^{-2}$ $\Omega$·cm. Other possible exceptions found in the literature are compositions doped with certain non-magnetic cations on purpose to increase the conductivity for reasons not connected with STT. Examples of satisfactory material compositions for a fixed magnet in numerous aspects of the invention exceed the just-described resistivity bound of $1\times10^{-2}$ $\Omega$·cm by at least 2 orders of magnitude. In some aspects of the invention, any ion in a ferrimagnetic oxide which gives up an electron to an oxygen atom is referred to as a magnetic ion, and in several devices the electrically resistive material comprises a cubic crystalline ferrimagnetic oxide and an outer electron shell of each magnetic ion in said cubic crystalline ferrimagnetic oxide has five 3d electrons or seven 4f electrons.

Through any solid possessing spontaneous magnetization:
  Electric current is transported only by movements of free electrons (if any are present).
  Spin current is transported by movements of: thermal magnons (always present) and free electrons (if any are present).
  Heat is transported by free electrons (if any are present), thermal phonons (quantized lattice vibrations, always present), and thermal magnons (always present).

Hatami et al teach thermoelectric spin-transfer torque (STT) in an all-metallic (i.e. having free electrons throughout) trilayer system comprised of a polarizing magnet, a normal (i.e. dielectric) spacer, and a free magnet. They appear to consider heat-driven flow of spin that is transported only by movements of electrons. All transport by magnons and phonons appears to be ignored. On this basis, Hatami et al appear to teach (see their equation 7) that the transferred spin torque is simply proportional to the mean electric conductance G of the system.

Numerous devices in accordance with the present invention of thermagnonic STT differ from Hatami et al by regarding the polarizing magnet as an insulator. In several aspects, the present invention considers the magnon mechanism (which appears to be neglected by Hatami et al) of transport through the polarizing magnet. In certain aspects, the present invention teaches the transport of spin by magnons through the polarizer to the polarizer/dielectric interface where the transported spin converts to spin transport by electron movements through the dielectric spacer, thence into the free magnet. But, in many aspects of the present invention, G=0 in which case Hatami et al appear to teach that STT vanishes. Hence, Hatami et al appear to teach away from numerous embodiments of the invention described herein.

Many devices in accordance with the invention include at least these three elements: an electric insulator possessing spontaneous magnetization, an electric conductor possessing spontaneous magnetization, and a non-magnetic metal positioned between these two elements. Version #1 of such devices comprises in sequence these elements: heater, magnonic polarizer, normal metal spacer, free magnet, and thermal disperser. Version #2 of such devices comprising in sequence these elements: heater, free magnet, normal metal spacer, magnonic polarizer, and thermal disperser. In some such devices, flow of heat from the heater creates torque on the moment of the free magnet. In several such devices, the heater includes a thermal barrier to minimize waste of heat.

Many such devices in accordance with the invention, include additional thermally conducting materials inserted between said elements to make a device whose function relies on spin-transfer torque. Several such devices include additional elements to make an oscillator, while other such devices includes additional elements to make cells of a magnetic random access memory. In some such devices, the chemical binding between a reservoir of magnons in the polarizer and the non-magnetic spacer is sufficiently strong to insure easy flow of spin current.

In some such devices, the magnonic polarizer is composed of a cubic-crystalline ferrimagnetic oxide in which the outer electron shell of each magnetic ion has five 3d electrons or seven 4f electrons. In several such devices each of the local magnetic elements within the magnetic monolayer at the ferrite/normal-metal interface has a high electron concentration in an unfilled atomic 4s shell. In certain such devices the oscillator is composed, in sequence, of a silicon CMOS substrate, pinned resistive magnet, base electrode with external terminal, free magnet, tunnel barrier, pinned magnet, antiferromagnet, thermal barrier, and pillar electrode with external terminal. In numerous such devices, the memory array is partly composed, in sequence, of a set of long parallel metal strips each lying underneath: one row of a rectangular array of memory cells, a resistive magnetic layer having via holes, upon which rests said rectangular array of memory cells, each of which is composed, in sequence, of a short metal strip with a cylindrical electrode passing through said via hole, a free magnet, a tunnel barrier, a pinned first magnet, a tunnel barrier, a second pinned magnet, an antiferromagnet, a thermal barrier, and an electrode surmounted by an electric terminal.

Some devices in accordance with the invention use an electrically resistive material which includes a crystalline material having only electrons bound to atomic nuclei to constitute ions, the crystalline material lacking free electrons. Depending on the aspect of the invention, the crystalline material may be either a single crystal or poly-crystalline. In several such devices, the electrically resistive material includes one or more atomic monolayer(s) in contact with the crystalline material, each atomic monolayer having atomic nuclei with electrons having unbalanced spin, and each of the atoms in the atomic monolayer having a partially-filled 3d electron shell. Hence, in many devices in accordance with the invention, an electrically resistive material comprises a cubic crystalline ferrimagnetic oxide or a hexagonal crystalline ferrimagnetic oxide.

In several aspects of the invention, a tunnel barrier 315 (FIG. 3B) is located at least partially between an electrode 321 and electrically conductive material 314, a spacer 317 is located between the electrically conductive material 314 and the electrically resistive material 318 and a terminal T2 is coupled to the spacer 317 (by a conductive trace) to pass electric current therethrough (i.e. through spacer 317) to the electrode 321.

In numerous aspects of the invention, a thermal barrier 412 (FIG. 11B) is located at least partially between a first electrode 421 and electrically conductive material 415, a second electrode 1108 is located at least partially in a via hole 1107V through the electrically resistive material 1107, wherein the second electrode 1108 electrically couples the spacer 1106 to a transistor 1111, and the spacer 1106 is in electrical contact with the second electrode 1108, and a strip 1109 multiple times longer than the spacer 1106, the strip 1109 (which passes through the plane of the paper in FIG. 11B) is oriented perpendicular to a longitudinal direction of the spacer 1106.

In several aspects of the invention, a tunnel barrier 1004 (FIG. 10B) is located at least partially between a first electrode 1001 and electrically conductive material 1005, wherein the spacer 1006 is located between the electrically conductive material 1005 and the electrically resistive material 1008, a second electrode 1009 located between the electrically resistive material 1008 and a diffuse-silicon resistor material 1011 so as to pass heat therethrough, and additional electrodes 1021, 1022 located in contact with the diffuse-silicon resistor material 1011 so as to pass electric current therethrough to at least the second electrode 1009.

The above description of the disclosed aspects, embodiments, devices, methods, etc. is provided to enable any person skilled in the art to make or use the present disclosure. Various modifications and adaptations to these aspects embodiments, devices, methods, etc will be readily apparent to those skilled in the art, and the generic principles defined herein may be applied to other aspects, embodiments, devices, methods, etc without departing from the spirit or scope of the disclosure. For example, although a thermal diffuser and a heater are used in combination to perform heat transfer in some aspects of the invention, the thermal diffuser may be replaced with a cooler (e.g. a thermoelectric cooler) with or without a heater in combination thereof, to perform heat transfer as described herein. Various methodologies described herein may be implemented by various means depending upon the application.

What is claimed is:

1. An integrated circuit comprising:
   an electrically conductive material possessing spontaneous magnetization;
   an electrically resistive material possessing spontaneous magnetization;
   wherein the electrically resistive material has an electrical conductance lower than the electrical conductance of the electrically conductive material, by at least multiple orders of magnitude;
   wherein the electrical conductive material and the electrically resistive material do not contact each other; and
   a spacer comprising a metal, said spacer comprising atomically unbound electrons to transfer spin between the electrically resistive material and the electrically conductive material;
   wherein the spacer is in direct contact with the electrically resistive material.

2. The integrated circuit of claim 1 wherein:
   the electrically resistive material comprises a crystalline material having only electrons bound to atomic nuclei to constitute ions, the crystalline material lacking free electrons.

3. The integrated circuit of claim 2 wherein:
   the electrically resistive material further comprises an atomic monolayer in contact with the crystalline material, the atomic monolayer comprising atomic nuclei with electrons having unbalanced spin, and each of a plurality of atoms in the atomic monolayer has a partially-filled 3d electron shell.

4. The integrated circuit of claim 1 further comprising:
   a heater located in thermal contact with at least one of the electrically resistive material, the electrically conductive material, and the spacer, the heater being so positioned as to cause an externally sourced flow of heat at least between the spacer and the electrically resistive material;
   a heat sink having greater thermal conductance than the electrically resistive material;
   wherein said heat sink is located in thermal contact with at least another of the electrically resistive material, the electrically conductive material and the spacer.

5. The integrated circuit of claim 4 wherein:
the heat sink comprises a silicon substrate; and
the heater comprises at least one of (a) tunnel barrier and (b) Joule-effect heater.

6. The integrated circuit of claim 4 further comprising:
a thermal barrier having smaller thermal conductance than the electrically resistive material;
wherein the heater is in thermal contact with each of the thermal barrier and the electrically conductive material.

7. The integrated circuit of claim 4 wherein:
the electrically resistive material is located at least partially between, and in direct contact with, each of the spacer and the heater.

8. The integrated circuit of claim 1 wherein: said metal is copper.

9. The integrated circuit of claim 1 wherein:
the electrically resistive material comprises a cubic crystalline ferrimagnetic oxide.

10. The integrated circuit of claim 1 wherein any ion in a ferrimagnetic oxide which gives up an electron to an oxygen atom is hereinafter referred to as a magnetic ion, wherein:
the electrically resistive material comprises a cubic crystalline ferrimagnetic oxide and an outer electron shell of each magnetic ion in said cubic crystalline ferrimagnetic oxide has five 3d electrons or seven 4f electrons.

11. The integrated circuit of claim 1 wherein:
the electrically resistive material comprises meghamite $\gamma Fe_2O_3$.

12. The integrated circuit of claim 1 further comprising:
a tunnel barrier located at least partially between an electrode and the electrically conductive material;
wherein the spacer is located between the electrically conductive material and the electrically resistive material;
a terminal is coupled to the spacer to pass electric current therethrough to the electrode.

13. The integrated circuit of claim 1 further comprising:
a thermal barrier located at least partially between a first electrode and a heater;
a second electrode located at least partially in a via hole through the electrically resistive material;
wherein the electrically resistive material is continuous, aside from a plurality of via holes of a memory array including at least one via hole for each cell in the memory array;
wherein the second electrode electrically couples the spacer to a transistor and the spacer is in electrical contact with the second electrode; and
a strip multiple times longer than the spacer.

14. The integrated circuit of claim 1 further comprising:
a tunnel barrier located at least partially between a first electrode and the electrically conductive material;
wherein the spacer is located between the electrically conductive material and the electrically resistive material;
a second electrode located between the electrically resistive material and a diffuse-silicon resistor material so as to pass heat therethrough; and
an additional electrode located in contact with the diffuse-silicon resistor material so as to pass electric current therethrough to at least the second electrode.

15. A method comprising:
using heat flow through a structure to change a first direction of magnetization of an electrically conductive magnet to a second direction of magnetization;
wherein the structure comprises said electrically conductive magnet separated from an electrically resistive magnet by a metal spacer;
wherein a majority of the heat that flows between at least the metal spacer and the electrically resistive magnet flows without an externally-added electrical current flowing therebetween; and
sensing said second direction of magnetization of the electrically conductive magnet.

16. The method of claim 15 wherein said using heat flow comprises:
generating said heat by passing current through a heater in the structure;
wherein said heater is comprised in or in direct thermal contact with at least one of the electrically conductive magnet, the metal spacer, and the electrically resistive magnet.

17. The method of claim 15 wherein:
said sensing comprises using a magnetic tunneling junction.

18. The method of claim 15 further comprising:
passing simultaneous electrical currents through a plurality of electrically conductive strips parallel to one another and located adjacent to the electrically resistive magnet in a memory cell, so as to generate a magnetic field that changes a direction of magnetization of the electrically resistive magnet, each strip extending over a column of memory cells.

19. The method of claim 15 wherein:
said second direction of magnetization of the electrically conductive magnet sensed by said sensing is different from another direction of magnetization of the electrically resistive magnet prior to said using heat flow.

20. The method of claim 15 wherein:
the heat flows continuously to keep a spin moment vector of the electrically conductive magnet in precession in an oscillator.

21. The integrated circuit of claim 1 further comprising:
a magnetic tunneling sensor located between the electrically conductive material and an electrode;
wherein the magnetic tunneling sensor comprises a tunnel barrier located between said electrically conductive material and another electrically conductive material.

22. The integrated circuit of claim 1 wherein:
the electrically resistive material comprises an atomic monolayer in said direct contact with the spacer.

23. The integrated circuit of claim 22 wherein:
the atomic monolayer comprises atomic nuclei with electrons having unbalanced spin.

24. The integrated circuit of claim 22 wherein:
each of a plurality of atoms in the atomic monolayer has a partially-filled 3d electron shell.

25. The integrated circuit of claim 1 further comprising:
a heater positioned to cause an externally sourced flow of heat at least between the spacer and the electrically resistive material.

26. The integrated circuit of claim 25 wherein:
the electrically resistive material is located in direct contact with the heater.

27. The integrated circuit of claim 1 further comprising:
a heater located in thermal contact with the electrically resistive material.

28. The integrated circuit of claim 1 further comprising:
a heater located in thermal contact with the electrically conductive material.

29. The integrated circuit of claim 1 further comprising:
a heater located in thermal contact with the spacer.

30. The integrated circuit of claim 1 further comprising:
a heater comprising a tunnel barrier.
31. The integrated circuit of claim 1 further comprising:
a heat sink having greater thermal conductance than the electrically resistive material.
32. The integrated circuit of claim 1 further comprising:
a heat sink located in thermal contact with the electrically conductive material.
33. The integrated circuit of claim 1 further comprising:
a heat sink located in thermal contact with the electrically resistive material.
34. The integrated circuit of claim 1 further comprising:
a thermal barrier having smaller thermal conductance than the electrically resistive material.
35. The integrated circuit of claim 25 wherein:
said metal is silver.
36. The integrated circuit of claim 25 wherein:
said metal is gold.
37. The integrated circuit of claim 25 wherein:
the electrically resistive material comprises a hexagonal crystalline ferrimagnetic oxide.
38. The integrated circuit of claim 25 wherein:
the electrically resistive material comprises a cubic crystalline ferrimagnetic oxide.
39. The integrated circuit of claim 25 wherein any ion in a ferrimagnetic oxide which gives up an electron to an oxygen atom is hereinafter referred to as a magnetic ion, wherein:
the electrically resistive material comprises a cubic crystalline ferrimagnetic oxide and an outer electron shell of each magnetic ion in said cubic crystalline ferrimagnetic oxide has five 3d electrons.
40. The integrated circuit of claim 25 wherein:
the electrically resistive material comprises nickel ferrite $NiFe_2O_4$.
41. The integrated circuit of claim 25 wherein:
the electrically resistive material comprises lithium-iron ferrite $Li_{0.5}Fe_{2.5}O_4$.
42. The integrated circuit of claim 25 wherein:
the electrically resistive material comprises manganese-magnesium ferrite $(Mn,Mg)Fe_2O_4$.
43. The integrated circuit of claim 25 wherein:
the electrically resistive material comprises lithium-zinc ferrite $(Li,Zn,Fe)_3O_4$.
44. The integrated circuit of claim 25 wherein:
the electrically resistive material comprises yttrium iron garnet $Y_3Fe_5O_{12}$.
45. The integrated circuit of claim 25 wherein:
the electrically resistive material comprises yttrium-gadolimium iron garnet $(Y,Gd)_3Fe_5O_{12}$.

46. The integrated circuit of claim 25 wherein:
the electrically resistive material comprises barium hexaferrite $BaFe_{12}O_{19}$.
47. The integrated circuit of claim 25 wherein:
the electrically resistive material comprises barium gadolinium-iron hexaferrite $Ba(Gd, Fe)_{12}O_{19}$.
48. The integrated circuit of claim 25 wherein:
the electrically resistive material comprises barium aluminum-iron hexaferrite $Ba(Fe, Al)_{12}O_{19}$.
49. The integrated circuit of claim 1 further comprising:
a tunnel barrier located at least partially between an electrode and the electrically conductive material.
50. The integrated circuit of claim 1 further comprising:
a terminal coupled to the spacer to pass electric current therethrough.
51. The integrated circuit of claim 1 further comprising:
a thermal barrier located at least partially between an electrode and a heater.
52. The integrated circuit of claim 1 further comprising:
a second electrode located at least partially in a via hole through the electrically resistive material.
53. The integrated circuit of claim 1 further comprising:
a strip multiple times longer than the spacer.
54. The integrated circuit of claim 1 further comprising:
a tunnel barrier located at least partially between an electrode and the electrically conductive material.
55. The integrated circuit of claim 1 further comprising:
an electrode located between the electrically resistive material and a diffuse-silicon resistor material.
56. The integrated circuit of claim 55 further comprising:
an additional electrode located in contact with the diffuse-silicon resistor material.
57. The method of claim 15 further comprising:
generating said heat by passing current through a heater in the structure.
58. The method of claim 57 wherein:
said heater is comprised in the electrically conductive magnet.
59. The method of claim 57 wherein:
said heater is comprised in the electrically resistive magnet.
60. The method of claim 57 wherein:
said heater is comprised in the metal spacer.
61. The method of claim 15 further comprising:
passing simultaneous electrical currents through at least one electrically conductive strip located adjacent to the electrically resistive magnet.

\* \* \* \* \*